(12) United States Patent
Bergantz et al.

(10) Patent No.: US 12,115,683 B2
(45) Date of Patent: Oct. 15, 2024

(54) CALIBRATION OF AN ELECTRONICS PROCESSING SYSTEM

(71) Applicant: Applied Materials, Inc., Santa Clara, CA (US)

(72) Inventors: Nicholas Michael Bergantz, Sunnyvale, CA (US); Damon K. Cox, Jarrell, TX (US); Alexander Berger, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/355,355

(22) Filed: Jul. 19, 2023

(65) Prior Publication Data

US 2023/0364794 A1    Nov. 16, 2023

Related U.S. Application Data

(62) Division of application No. 16/861,000, filed on Apr. 28, 2020, now Pat. No. 11,766,782.
(Continued)

(51) Int. Cl.
*B25J 9/16* (2006.01)
*B65G 47/90* (2006.01)
(Continued)

(52) U.S. Cl.
CPC .......... *B25J 9/1692* (2013.01); *B65G 47/905* (2013.01); *H01L 21/67167* (2013.01);
(Continued)

(58) Field of Classification Search
CPC .... B25J 9/1692; B25J 9/1697; B25J 11/0095; B25J 13/08; B25J 9/0084; B25J 9/0096;
(Continued)

(56) References Cited

U.S. PATENT DOCUMENTS

| 3,709,608 A | 1/1973 | Degnan |
| 5,934,856 A | 8/1999 | Asakawa |

(Continued)

FOREIGN PATENT DOCUMENTS

| CN | 2726109 Y | 9/2005 |
| EP | 1083424 A2 | 3/2001 |

(Continued)

OTHER PUBLICATIONS

International Search Report and Written Opinion for International application No. PCT/US2021/022616 dated Jul. 12, 2021, 15 pages.

*Primary Examiner* — Jerome Grant, II
(74) *Attorney, Agent, or Firm* — Lowenstein Sandler LLP

(57) ABSTRACT

A first robot arm places a calibration object into a load lock that separates a factory interface from a transfer chamber using a first taught position. A second robot arm retrieves the calibration object from the load lock using a second taught position. A controller determines, using a sensor, a first offset amount between a calibration object center of the calibration object and a pocket center of the second robot arm. The controller determines a characteristic error value that represents a misalignment between the first taught position of the first robot arm and the second taught position of the second robot arm based on the first offset amount. The first robot arm or the second robot arm uses the first characteristic error value to compensate for the misalignment for objects transferred between the first robot arm and the second robot arm via the load lock.

18 Claims, 16 Drawing Sheets

Related U.S. Application Data

(60) Provisional application No. 62/991,016, filed on Mar. 17, 2020.

(51) Int. Cl.
| | |
|---|---|
| *H01L 21/67* | (2006.01) |
| *H01L 21/677* | (2006.01) |
| *H01L 21/68* | (2006.01) |
| *H01L 21/687* | (2006.01) |
| *B25J 11/00* | (2006.01) |
| *B25J 13/08* | (2006.01) |

(52) U.S. Cl.
CPC .. *H01L 21/67196* (2013.01); *H01L 21/67259* (2013.01); *H01L 21/67706* (2013.01); *H01L 21/67742* (2013.01); *H01L 21/67745* (2013.01); *H01L 21/68* (2013.01); *H01L 21/68707* (2013.01); *B25J 9/1697* (2013.01); *B25J 11/0095* (2013.01); *B25J 13/08* (2013.01)

(58) Field of Classification Search
CPC ... B25J 9/1664; B25J 15/0014; B65G 47/905; H01L 21/67167; H01L 21/67196; H01L 21/67259; H01L 21/67706; H01L 21/67742; H01L 21/67745; H01L 21/68; H01L 21/68707; H01L 21/67748
USPC ....................................................... 700/254
See application file for complete search history.

(56) References Cited

U.S. PATENT DOCUMENTS

| | | | |
|---|---|---|---|
| 6,375,748 B1 | 4/2002 | Yudovsky | |
| 6,395,094 B1 | 5/2002 | Tanaka | |
| 6,463,782 B1 | 10/2002 | Shen | |
| 8,185,242 B2 | 5/2012 | Wong | |
| 8,489,237 B2 | 7/2013 | Gage | |
| 8,509,938 B2* | 8/2013 | Krupyshev | ........... H01L 21/682 |
| | | | 700/47 |
| 8,954,287 B2 | 2/2015 | Rodnick | |
| 9,075,411 B2* | 7/2015 | Aiso | ..................... B25J 9/1692 |
| 9,281,222 B2 | 3/2016 | Weaver | |
| 9,735,039 B2* | 8/2017 | Hwang | ................... B32B 38/18 |
| 10,134,623 B2 | 11/2018 | Yin | |
| 10,541,168 B2 | 1/2020 | Tan | |
| 10,710,819 B1 | 7/2020 | Thanu | |
| 11,766,782 B2* | 9/2023 | Bergantz | ........... H01L 21/67748 |
| | | | 700/254 |
| 2003/0186563 A1 | 10/2003 | Kobayashi | |
| 2004/0249595 A1 | 12/2004 | Vermeer | |
| 2005/0004697 A1 | 1/2005 | Krupyshev | |
| 2009/0259337 A1 | 10/2009 | Harrold | |
| 2010/0008688 A1 | 1/2010 | Kimura | |
| 2012/0136471 A1 | 5/2012 | Krupyshev | |
| 2017/0115657 A1 | 4/2017 | Trussell | |
| 2018/0269088 A1 | 9/2018 | Nozawa | |
| 2019/0109031 A1 | 4/2019 | Sugawara | |
| 2019/0172738 A1 | 6/2019 | Hiester | |
| 2019/0172742 A1 | 6/2019 | Mochizuki | |
| 2019/0252234 A1 | 8/2019 | Genetti | |
| 2021/0057256 A1 | 2/2021 | Bergantz | |
| 2021/0125849 A1 | 4/2021 | Finkelman | |
| 2021/0291374 A1 | 9/2021 | Bergantz | |
| 2021/0291375 A1 | 9/2021 | Bergantz | |

FOREIGN PATENT DOCUMENTS

| | | |
|---|---|---|
| KR | 100563092 B1 | 3/2006 |
| TW | 201806064 A | 2/2018 |

* cited by examiner

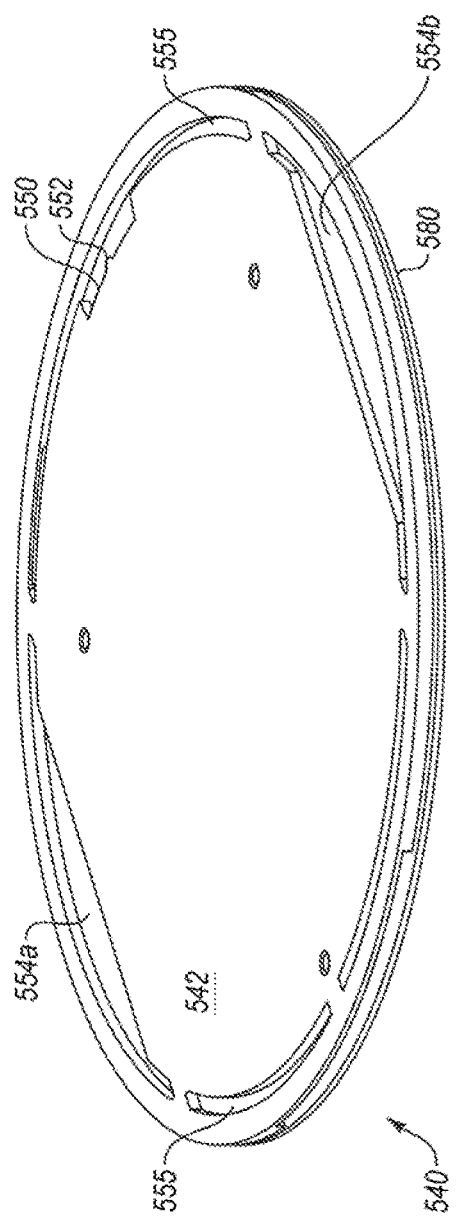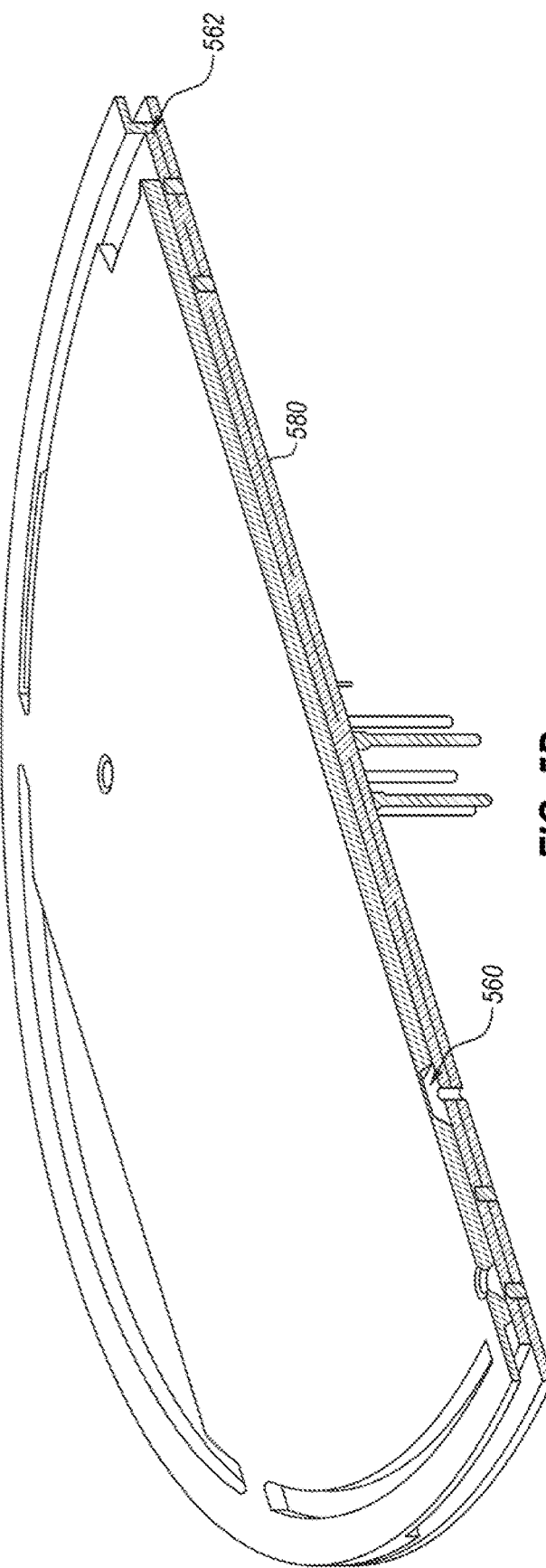

CALIBRATION OF AN ELECTRONICS PROCESSING SYSTEM

RELATED APPLICATIONS

This patent application is a divisional of U.S. application Ser. No. 16/861,000, filed Apr. 28, 2020, which claims the benefit under 35 U.S.C. § 119(e) of U.S. Provisional Application No. 62/991,016, filed Mar. 17, 2020, both of which are incorporated by reference herein.

TECHNICAL FIELD

Embodiments of the present disclosure relate, in general, to methods and systems for calibrating components of an electronics processing system, and in particular to calibrating transfer sequences between components of an electronics processing system.

BACKGROUND

An electronics processing system may include one or more robot arms for transporting a substrate from a first station of the electronics processing system to a second station of the electronics processing system. In electronics processing systems, a substrate or an object is to be moved from the first station and placed at a target orientation and position at the second station. Frequently, one or more system errors associated with the first station, the second station and/or one or more robot arms may prevent a robot arm from placing the substrate or the object at a target orientation and position at the second station. For example, the electronics processing system may include an aligner station and a processing chamber, where a substrate or object may be retrieved from the aligner station by a robot arm for transfer to the processing chamber at a target orientation. The aligner station and/or the processing chamber may be associated with a characteristic error resulting from a variety of sources (e.g., the aligner station and/or the processing chamber was not installed properly during construction of the processing system, small errors in robot arm positioning and/or orientation, etc.). Accordingly, when the substrate or object is transferred from the aligner station and ultimately to the processing chamber, the substrate or object may have a small error in orientation and/or positioning.

SUMMARY

Some of the embodiments described cover a method of calibrating a transfer sequence between an aligner station and another station of an electronics processing system. A calibration object is placed at a target orientation in a station of an electronics processing device by a first robot arm, and then retrieved from the station by the first robot arm. The calibration object is transferred to an aligner station using the first robot arm, a second robot arm and/or a load lock, wherein the calibration object has a first orientation at the aligner station. The first orientation at the aligner station is determined. A characteristic error value is determined based on the first orientation. In one embodiment, a difference between the first orientation and an initial target orientation at the aligner station is determined, wherein the initial target orientation at the aligner station is associated with the target orientation in the first station, and the characteristic error value is determined based on the difference between the first orientation and the initial target orientation. The characteristic error value is recorded in a storage medium. The aligner station is to use the characteristic error value for alignment of objects to be placed in the first station.

In some embodiments, a calibration object for an electronics processing system includes a body sized to fit through a slit valve of the electronics processing system. The body includes a first plurality of kinematic coupling interfaces in the body, the first plurality of kinematic coupling interfaces being configured to engage with a respective first plurality of registration features of a first station of the electronics processing system and to guide the calibration object to a target position and a target orientation at the first station. The body further includes a fiducial disposed at a side of the body, wherein the fiducial is usable to determine an orientation of the calibration object. The calibration object is configured to achieve a target position and/or orientation when placed into a station of the electronics processing system, even when the calibration object is initially placed at the station with an incorrect orientation and/or position.

In some embodiments, an electronics processing system comprises a transfer chamber comprising a first robot arm, a plurality of processing chambers connected to the transfer chamber, a load lock connected to the transfer chamber, a factory interface connected to the load lock, the factory interface comprising a second robot arm and an aligner station, and a controller operatively connected to the first robot arm, the second robot arm and the aligner station. The controller is to cause the first robot arm or the second robot arm to retrieve a calibration object from a first station of an electronics processing system, the calibration object having a target orientation in the first station, wherein the first station is in a processing chamber of the plurality of processing chambers, a side storage pod (SSP), the load lock, a load port, or a front opening unified pod (FOUP). The controller is further to cause the calibration object to be transferred to the aligner station using at least one of the first robot arm, the second robot arm or the load lock, wherein the calibration object has a first orientation at the aligner station. The controller is further to determine the first orientation at the aligner station. In one embodiment, the controller determines a difference between the first orientation at the aligner station and an initial target orientation at the aligner station, wherein the initial target orientation at the aligner station is associated with the target orientation in the first station. The controller is further to determine a first characteristic error value associated with the first station based on first orientation (e.g., based on the difference between the first orientation and the initial target orientation). The controller is further to record the first characteristic error value in a storage medium, wherein the aligner station is to use the first characteristic error value for alignment of objects to be placed in the first station.

In some embodiments, a method includes placing, by a first robot arm in a first one of a factory interface or a transfer chamber, a calibration object into a load lock that separates the factory interface from the transfer chamber, wherein the calibration object is placed into the load lock such that a calibration object center is at a first target location associated with a first taught position of the first robot arm, wherein a first pocket center of a first blade of the first robot arm nominally corresponds to the first target location for the first taught position, and wherein the factory interface, the transfer chamber, and the load lock are components of an electronics processing system. The method further includes retrieving, by a second robot arm in a second one of the factory interface or the transfer chamber, the calibration object from the load lock onto a second blade of the second robot arm using a second taught position of the second robot arm, wherein a second pocket center of the second blade nominally corresponds to the first target location for the second taught position, and wherein the calibration object center is offset from the second pocket center by a first offset amount after retrieving the calibration object. The method further includes determining, using a sensor that is in or connected to the second one of the factory interface or the transfer chamber, the first offset amount between the calibration object center and the second pocket center. The method further includes determining a first characteristic error value that represents a misalignment between the first taught position of the first robot arm and the second taught position of the second robot arm based on the first offset amount. The method further includes recording the first characteristic error value in a storage medium, wherein one of the first robot arm or the second robot arm is to use the first characteristic error value to compensate for the misalignment for objects transferred between the first robot arm and the second robot arm via the load lock.

In some embodiments, an electronics processing system comprises a load lock, a factory interface connected to a first side of the load lock, a transfer chamber connected to a second side of the load lock, and a controller. The controller is to cause a first robot arm in a first one of the factory interface or the transfer chamber to place a calibration object into the load lock, wherein the calibration object is to be placed into the load lock such that a calibration object center is at a first target location associated with a first taught position of the first robot arm, wherein a first pocket center of a first blade of the first robot arm nominally corresponds to the first target location for the first taught position. The controller is further to cause a second robot arm in a second one of the factory interface or the transfer chamber to retrieve the calibration object from the load lock onto a second blade of the second robot arm using a second taught position of the second robot arm, wherein a second pocket center of the second blade nominally corresponds to the first target location for the second taught position, and wherein the calibration object center is offset from the second pocket center by a first offset amount after retrieving the calibration object. The controller is further to determine, using a sensor that is in or connected to the second one of the factory interface or the transfer chamber, the first offset amount between the calibration object center and the second pocket center. The controller is further to determine a first characteristic error value that represents a misalignment between the first taught position of the first robot arm and the second taught position of the second robot arm based on the first offset amount. The controller is further to record the first characteristic error value in a storage medium, wherein one of the first robot arm or the second robot arm is to use the first characteristic error value to compensate for the misalignment for objects transferred between the first robot arm and the second robot arm via the load lock.

In some embodiments, a non-transitory computer readable medium comprises instructions that, when executed by a processing device, cause the processing device to perform the operations of any of the above discussed methods.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 5C-5D illustrate an example calibration object, according to aspects of the present disclosure.

DETAILED DESCRIPTION OF EMBODIMENTS

Figure 1:
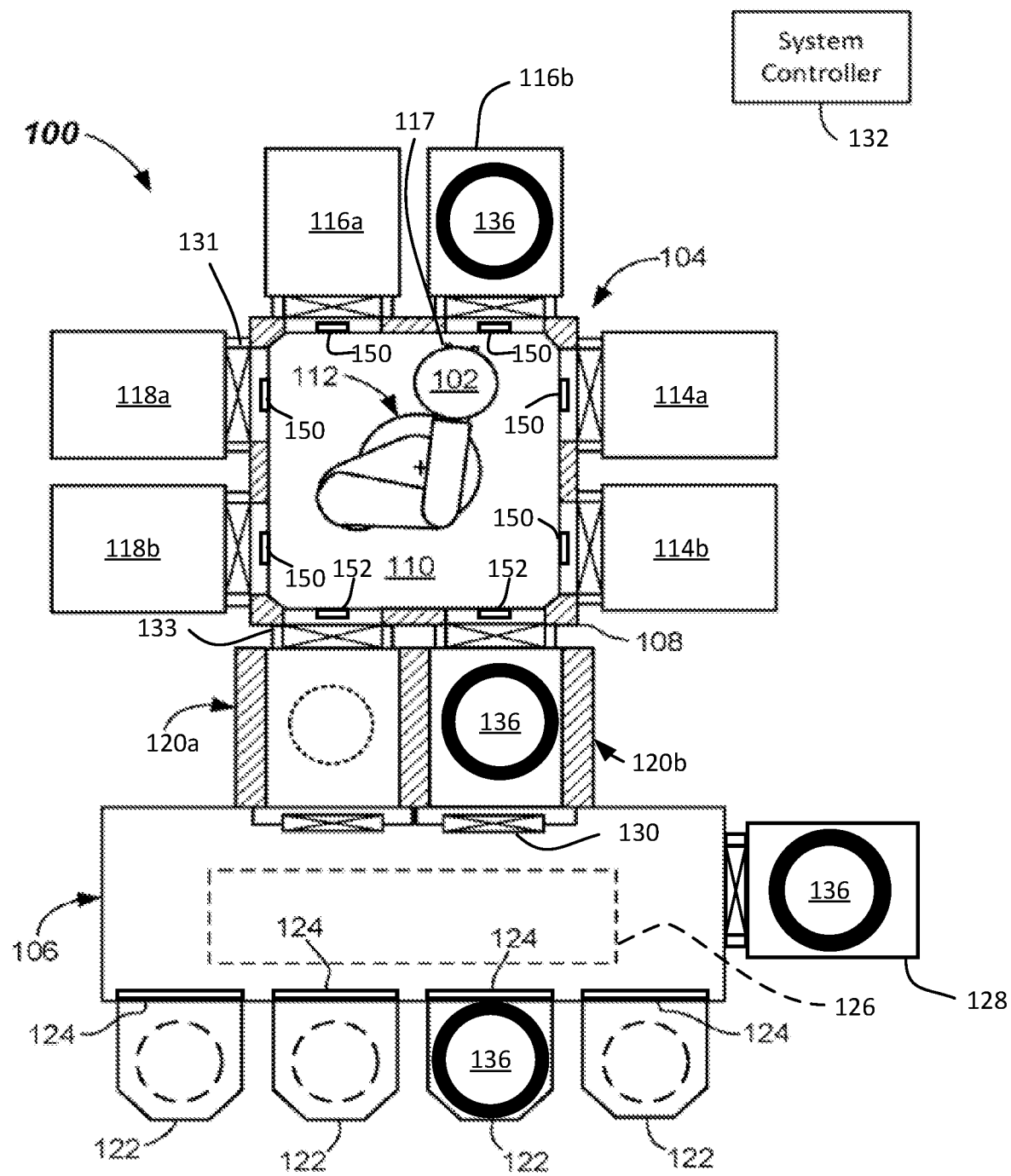
FIG. 1 is a top schematic view of an example electronic processing system, according to aspects of the present disclosure.

Embodiments described herein are related to methods and systems for calibrating one or more components of an electronics processing system. The components that are calibrated may include one or more stations (e.g., an aligner station, a station of a processing chamber, a load lock, a load port, a front opening unified pod (FOUP), a side storage pod (SSP), and so on) and/or one or more robot arms (e.g., of a factory interface robot and/or a transfer chamber robot). In embodiments, multiple components of the electronics processing system are calibrated to one another such that cumulative error by any of the multiple components is eliminated or reduced. Some embodiments described herein cover calibration of a wafer transfer sequence between two stations (e.g., between an aligner station and a station of the processing chamber). Other embodiments described herein cover calibration of wafer transfer between two robot arms at a station (e.g., between two robot arms that transfer substrates to one another via a load lock).

In one embodiment, a calibration object, such as a calibration ring, a calibration disc, or a calibration wafer, is used to determine one or more characteristic error values associated with a station (e.g., a processing chamber) of the electronics processing system. The characteristic error value(s) may then be used to transfer objects (e.g., wafers, process kit rings, etc.) from other stations in the electronics processing system to the station with the characteristics error and/or from the station to the other stations. Characteristic error values may be determined for some or all of the stations in the electronics processing system. The characteristic error values of multiple stations may be combined to determine any angular and/or positional changes that are to be made when transferring objects between the multiple stations in some embodiments. For example, a first characteristic error value may be determined for a first station, a second characteristic error value may be determined for a second station, and the first and second characteristic error values may be added together to determine a combined characteristic error value to use in transferring objects between the first and second stations.

In one embodiment, a calibration object is used to determine characteristic error values associated with stations. In some embodiments, the calibration object may be placed at a station (e.g., a processing chamber) at a target orientation and/or a target position. A first robot arm of a first robot (e.g., a transfer chamber robot) may retrieve the calibration object and place the calibration object at a load lock of the electronics processing system. The calibration object may be retrieved, by a second robot arm of a second robot (e.g., a factory interface robot), from the load lock and placed at a first orientation and/or a first position at an aligner station of the electronics processing system. A difference between the first orientation and an initial target orientation may be determined. Additionally, or alternatively, a difference between the first position and an initial target position may be determined using the aligner station. A first characteristic error value associated with the station (e.g., processing chamber) may be determined based on the difference between the first orientation and the initial target orientation. One or more additional characteristic error values associated with the station may be determined based on the difference between the first position and the initial target position. The characteristic error value(s) may be stored at a storage medium. After the characteristic error value or values are determined and stored at the storage medium, an object may be received at the aligner station to be processed at the station (e.g., processing chamber). The characteristic error value(s) associated with the processing chamber may be retrieved from the storage medium and the object may be aligned to the initial target orientation and/or the initial target position based on the characteristic error value, as modified by the characteristic error value(s).

In one embodiment, a calibration object is used to determine and correct an offset between taught positions of two robot arms that transfer objects to one another via a load lock. The first robot arm may have a first taught position at the load lock, and the second robot arm may have a second taught position at the load lock that should line up with the first taught position. However, there is often some inaccuracy with regards to the taught positions. For example, the first robot arm (e.g., of a factory interface robot) may be taught to place a substrate at the load lock such that a first pocket center of the first robot arm is at a center of the load lock (center in the x-y plane). Thus, if the substrate has a center that lines up with the first pocket center when the substrate is placed in the load lock, the center of the substrate will correspond with the center of the load lock chamber. However, the robot arm may actually place the substrate at an offset from the center of the load lock chamber. The same issue may occur for a second robot arm (e.g., of a transfer chamber robot), which may also be taught to place a substrate at the load lock such that a second pocket center of the second robot arm is at the center of the load lock (center in the x-y plane).

To identify and correct for the offset between the taught positions of the first and second robot arms, in one embodiment a first robot arm places a calibration object (e.g., a calibration wafer or a substrate) into a load lock, wherein the calibration object is placed into the load lock such that a calibration object center is at a first target location associated with a first taught position of the first robot arm, wherein a first pocket center of a first blade of the first robot arm nominally corresponds to the first target location for the first taught position. A second robot arm retrieves the calibration object from the load lock onto a second blade of the second robot arm using a second taught position of the second robot arm, wherein a second pocket center of the second blade nominally corresponds to the first target location for the second taught position, and wherein the calibration object center is offset from the second pocket center by a first offset amount after retrieving the calibration object. A sensor (e.g., a local center finder or a sensor of an aligner station) is used to determine the first offset amount between the calibration object center and the second pocket center. A first characteristic error value that represents a misalignment between the first taught position of the first robot arm and the second taught position of the second robot arm based on the first offset amount is then determined. The first characteristic error value is recorded in a storage medium. The first robot arm or second robot arm then uses the first characteristic error value to compensate for the misalignment for objects transferred between the first robot arm and the second robot arm via the load lock.

By calibrating the multiple components (e.g., wafer transfer sequence between multiple components) as described in embodiments herein prior to placing objects (e.g., substrates, wafers, replaceable parts or components, etc.) in a target station (e.g., a processing chamber), a likelihood that each object will be positioned at a target orientation and/or position at the processing chamber increases. By increasing the likelihood that each object will be positioned at the target orientation and/or position, a number of alignment operations to be performed at the destination station is reduced, decreasing overall system latency. Additionally, the accuracy of the orientation (e.g., yaw) and/or position of placed objects is improved over conventional systems in embodiments, with an orientation accuracy as high +/−0.2°, +/−0.1°, or +/−0.01° in embodiments. Similarly, by reducing the number of alignment operations to be performed at the destination station (e.g., processing chamber), a likelihood that the object, or a robot arm placing the object at the processing chamber, will be damaged as a result of an incorrect x-axis, y-axis, or yaw-axis motion decreases. Additionally, the amount of time that it takes to properly insert new substrates, wafers and/or replaceable parts (e.g., process kit rings) into destination stations (e.g., processing chambers) may be reduced in embodiments by ensuring that the parts are inserted at a proper orientation and/or position on a first attempt.

FIG. 1 is a top schematic view of an example electronics processing system 100, according to one aspect of the disclosure. Electronics processing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Electronics processing system 100 may include a mainframe 104 and a factory interface 106 coupled to mainframe 104. Mainframe 104 may include a housing 108 having a transfer chamber 110 therein. Transfer chamber 110 may include one or more processing chambers (also referred to as process chambers) 114a, 114b, 116a, 116b, 118a, 118b disposed therearound and coupled thereto. Processing chambers 114a, 114b, 116a, 116b, 118a, 118b may be coupled to transfer chamber 110 through respective ports 131, which may include slit valves or the like.

Note that an approximately square shaped mainframe having four sides (also referred to as facets) is shown, with multiple processing chambers connected to each facet. However, it should be understood that a facet may include a single processing chamber or more than two processing chambers coupled thereto. Additionally, the mainframe 104 may have other shapes, such as a rectangular shape (in which different facets may have different lengths) or a radial shape with more than four facets (e.g., with five, six, or more facets).

Processing chambers 114a, 114b, 116a, 116b, 118a, 118b may be adapted to carry out any number of processes on substrates 102. A same or different substrate process may take place in each processing chamber 114a, 114b, 116a, 116b, 118a, 118b. A substrate process may include atomic layer deposition (ALD), physical vapor deposition (PVD), chemical vapor deposition (CVD), etching, annealing, curing, pre-cleaning, metal or metal oxide removal, or the like. In one example, a PVD process may be performed in one or both of process chambers 114a, 114b, an etching process may be performed in one or both of process chambers 116a, 116b, and an annealing process may be performed in one or both of process chambers 118a, 118b. Other processes may be carried out on substrates therein. Processing chambers 114a, 114b, 116a, 116b, 118a, 118b may each include a substrate support assembly. The substrate support assembly may be configured to hold a substrate in place while a substrate process is performed.

As described above, an etching process may be performed at one or more processing chambers 114a, 114b, 116a, 116b, 118a, 118b. As such, some processing chambers 114a, 114b, 116a, 116b, 118a, 118b (such as etch chambers) may include edge rings (also referred to as process kit rings) 136 that are placed at a surface of the substrate support assembly. In some embodiments, the process kit rings may occasionally undergo replacement. While replacement of process kit rings in conventional system includes disassembly of a processing chamber 114a, 114b, 116a, 116b, 118a, 118b by an operator to replace the process kit ring, electronics processing system 100 may be configured to facilitate replacement of process kit rings without disassembly of a processing chamber 114a, 114b, 116a, 116b, 118a, 118b by an operator.

Transfer chamber 110 may also include a transfer chamber robot 112. Transfer chamber robot 112 may include one or multiple robot arms where each robot arm includes one or more end effectors 117 (also referred to herein as blades) at the end of the robot arm. The end effector 117 may be configured to handle particular objects, such as wafers. Alternatively, or additionally, the end effector 117 may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on.

In some embodiments, ports 131 and/or slit values are at interfaces between processing chambers 114a, 114b, 116a, 116b, 118a, 118b and transfer chamber 110. Local center finders (LCFs) 150 are positioned at or proximate to each such port 131 or slit value. The local center finders 150 are each configured to determine a center of an object (e.g., a ring, wafer, substrate, etc.) passing through the associated port 131 or slit value. LCFs 150 may include an arrangement of laser and detector pairs. Each laser may project a laser beam, which may be received by a corresponding detector in a laser and detector pair. In embodiments, the lasers direct the laser beams vertically or at an angle relative to vertical. Each detector is positioned in the path of a laser beam from a corresponding laser. When an object (e.g., a calibration object, a substrate, a wafer, etc.) is passed through the port 131 or slit valve, it blocks the laser beams such that the laser beams are not received by the detectors. Based on known information about a size and shape of the calibration object or other object passing through the port 131 or slit valve, known information about positions of the lasers and detectors, and known information about respective positions of the transfer chamber robot 112 at which each of the respective detectors stopped receiving a laser beam, a center of the calibration object or other known object may be determined. Other types of LCFs may also be used, such as camera-based local center finders and/or runout ribbon-based local center finders.

One or more load locks 120a, 120b may also be coupled to housing 108 and transfer chamber 110. Load locks 120a, 120b may be configured to interface with, and be coupled to, transfer chamber 110 on one side and factory interface 106 on another side. Load locks 120a, 120b may have an environmentally-controlled atmosphere that may be changed from a vacuum environment (wherein substrates may be transferred to and from transfer chamber 110) to an at or near atmospheric-pressure (e.g., with inert-gas) environment (wherein substrates may be transferred to and from factory interface 106) in some embodiments. In some embodiments, one or more load locks 120a, 120b may be a stacked load lock having one or more upper interior chambers and one or more lower interior chambers that are located at different vertical levels (e.g., one above another). In some embodiments, a pair of upper interior chambers are configured to receive processed substrates from transfer chamber 110 for removal from mainframe 104, while a pair of lower interior chambers are configured to receive substrates from factory interface 106 for processing in mainframe 104. In some embodiments, one or more load locks 120a, 120b may be configured to perform a substrate process (e.g., an etch or a pre-clean) on one or more substrates 102 received therein.

In embodiments, ports 133 and/or slit valves separate the transfer chamber 110 from the load locks 120a, 120b. LCFs 152 are positioned at or proximate to each such port 133 and/or slit value. The LCFs may be used to determine a center of objects (e.g., calibration objects, wafers, substrates, etc.) on robot arm 112 while such objects are placed in the load lock or removed from the load lock by the robot arm 112.

Factory interface (FI) 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 102 between substrate carriers (also referred to as containers) 122 and load lock 120. Factory interface robot 126 may include one or more robot arms and may be or include a SCARA robot. In some embodiments, factory interface robot 126 may have more links and/or more degrees of freedom than transfer chamber robot 112. Factory interface robot 126 may include an end effector on an end of each robot arm. The end effector may be configured to pick up and handle specific objects, such as wafers. Alternatively, or additionally, the end effector may be configured to handle objects such as process kit rings.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments.

In some embodiments, a side storage pod (SSP, not shown) is coupled to the FI 106.

The substrate carriers 122 as well as load ports 124, substrate carriers 122, load locks 120a, 120b, SSPs, and processing chambers 114a, 114b, 116a, 116b, 118a, 118b are each considered to be or include stations herein. Another type of station is an aligner station 128. In some embodiments, transfer chamber 110, process chambers 114a, 114b, 116a, 116b, and 118a, 118b, and load lock 120 may be maintained at a vacuum level. Electronics processing system 100 may include one or more ports 130, 131, 133 (e.g., vacuum ports) that are coupled to one or more stations of electronics processing system 100. For example, ports 130 (e.g., vacuum ports) may couple factory interface 106 to load locks 120. Additional ports 133 (e.g., vacuum ports) may be coupled to load locks 120 and disposed between load locks 120 and transfer chamber 110, as discussed above. Each of the ports 130, 133, 131 may include slit valves that separate a vacuum environment from a higher pressure (e.g., atmospheric pressure) environment.

In some embodiments, an aligner station 128 is coupled to FI 106. Alternatively, aligner station 128 may be housed in FI 106. A port separates aligner station 128 from the FI 106 in some embodiments. Aligner station 128 is configured to align substrates, fixtures, and/or other objects (e.g., process kit rings) to a target orientation. Aligner station 128 includes a substrate support onto which an object can be placed. Once an object is placed on the substrate support, the substrate support and object placed thereon are rotated, and an initial orientation on the aligner station and a target orientation on the aligner station may be detected based on such orientation.

In one embodiment, the aligner station 128 includes one or more pairs of lasers and detectors (e.g., a line of laser and detector pairs). The laser(s) may each project a laser beam that is vertical or at an angle to vertical. Each detector may be in a path of a laser beam, and detects the laser beam when the laser beam is received by the detector. As the supported object (e.g., a calibration object, a substrate, a wafer, etc.) is rotated, one or more of the laser beams is interrupted by the object such that it is not received by a detector for each rotation setting. This information may be used to determine a distance between an edge of the object at a particular location that interrupted the one or more laser beams and a center of the aligner station for each rotation setting of the aligner station. Each object includes a fiducial such as a flat, a notch, a projection, etc. that can be detected by the aligner station. For example, as the object is rotated, the distance between the edge of the object and the center of the aligner station may be determined for each rotation setting, and a known shape of the fiducial may be used to identify the fiducial in the object from the determined distances. Once the rotation setting associated with the fiducial location is identified, the phase of the object can be determined. This information can be used to determine a target orientation of the object as well as an initial orientation that the object had when it was placed at the aligner station 128. Additionally, aligner station 128 may detect runout of a circular object placed off center from a center of the aligner station based on the detected phase of the object and the distances between the edge of the object and the center of the aligner station for each rotation setting. Other detection mechanisms may also be used to detect orientation and/or runout of objects at the aligner station.

Electronics processing system 100 may also include a system controller 132. System controller 132 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 132 may include a data storage device (e.g., one or more disk drives and/or solid state drives), a main memory, a static memory, a network interface, and/or other components. System controller 132 may execute instructions to perform any one or more of the methodologies and/or embodiments described herein. The instructions may be stored on a computer readable storage medium, which may include the main memory, static memory, secondary storage and/or processing device (during execution of the instructions). System controller 132 may also be configured to permit entry and display of data, operating commands, and the like by a human operator.

In some embodiments, system controller 132 causes electronics processing system 100 to perform one or more calibration procedures to generate calibration data (e.g., characteristic error values) associated with one or more stations, one or more robots and/or one or more wafer transfer sequences. System controller 132 stores the calibration values (e.g., characteristic error values) in one or more data storage devices. System controller 132 later uses appropriate calibration values when instructing the aligner station 128 to align an object, when instructing the FI robot 126 to retrieve or place an object and/or when instructing the transfer chamber robot 112 to retrieve or place an object.

FIG. 1 schematically illustrates transfer of an edge ring (or other process kit ring) 136 into a processing chamber 114a, 114b, 116a, 116b, 118a, 118b. However, it should be understood that other objects other than edge rings may also be transferred using the same techniques that are described with reference to edge rings. Accordingly, it should be understood that embodiments described with reference to edge rings also apply to substrates, cover wafers, multipurpose wafers, calibration objects, replaceable parts other than edge rings, test wafers, and so on.

According to one aspect of the disclosure, an object such as an edge ring 136 is removed from a substrate carrier 122 (e.g., a FOUP) or SSP via factory interface robot 126 located in the factory interface 106, or alternatively, is loaded directly into the factory interface 106. In some embodiments, system controller 132 determines a transfer recipe for the object (e.g., edge ring 136). The transfer recipe may indicate a transfer path that the object (e.g., edge ring 136) is to follow while being transported from substrate carrier 122 or SSP to a particular processing chamber 114a, 114b, 116a, 116b, 118a, 118b. For example, the transfer recipe may indicate that the object (e.g., edge ring 136) is to be moved from aligner station 128 to a particular load lock 120a, 120b to processing chamber 116a, 116b.

As discussed above, aligner station 128 is configured to align an object such as edge ring 136 to achieve a target orientation of the object (e.g., edge ring 136) at a destination station (e.g., at a processing chamber 114a, 114b, 116a, 116b, or 118a, 118b). Aligner station 128 may rotate the object (e.g., edge ring 136) in a positive or negative yaw-axis direction (e.g., clockwise or counterclockwise) to achieve an initial target orientation of the object (e.g., edge ring 136) at aligner station 128. In some embodiments, aligner station 128 may additionally or alternatively translate the object (e.g., edge ring 136) in a positive or negative x-axis and/or y-axis direction to align the object (e.g., edge ring 136) at aligner station 128. In some embodiments, an x-direction offset and/or a y-direction offset of the object may be determined, and the offset(s) may be used to pick up the object such that a center of the object corresponds to a center of a pocket in a blade of the robot arm of the FI robot 126.

The initial target orientation of object (e.g., edge ring 136) at aligner station 128 may nominally correspond with a target orientation of the object (e.g., edge ring 136) at a destination station (e.g., at processing chamber 114a, 114b, 116a, 116b, or 118a, 118b). For example, edge ring 136 may include a flat that is to be aligned with a corresponding flat in a substrate support assembly around which the edge ring 136 is to be placed in a processing chamber. Failure to accurately place the edge ring 136 at the target orientation in the processing chamber may result in non-uniformities in generated plasma during processing, in uneven wear of the edge ring 136, and/or other problems. In an ideal setup, with no robot position and/or rotation error, no misadjustment of a processing chamber relative to the transfer chamber, etc., edge rings aligned to the initial target orientation at the aligner station should be orientated such that they will ultimately have a target orientation in any processing chamber once placed in that process chamber. However, different robot errors may occur for placement of edge ring 136 in each of the processing chambers. Additionally, one or more of the processing chambers may have a slight misalignment or misadjustment. Embodiments described herein provide a calibration procedure that corrects for any such robot errors, misalignments and/or misadjustments, as is described more fully below.

In one embodiment, the factory interface robot 126 positions the object (e.g., edge ring 136) at a first orientation at aligner station 128. System controller 132 may determine, based on a transfer recipe for the object (e.g., edge ring 136), an alignment recipe to be performed at aligner station 128 to align the object (e.g., edge ring 136) to a corrected target orientation and/or a corrected target position. The corrected target orientation may correspond to an initial target orientation at a source station (e.g., at the aligner station 128) as adjusted by a characteristic error value (e.g., a characteristic angular error) associated with the transfer recipe. Similarly, the corrected target position may correspond to an initial target position at a source station (e.g., at aligner station) as adjusted by a characteristic error value (e.g., a characteristic positional error) associated with the transfer recipe. In one embodiment, the characteristic error value(s) are associated with a particular processing chamber. In one embodiment, the characteristic error value(s) are associated with a particular processing chamber plus a particular load lock chamber. In one embodiment, the characteristic error value(s) are associated with a particular transfer sequence for moving the object from a source station (e.g., the aligner station 128) to a destination station (e.g., processing chamber 116a, 116b). The alignment recipe may include the characteristic error value(s). In some embodiments, the aligner station 128 aligns the object (e.g., edge ring 136) according to the alignment recipe, which may include moving the object (e.g., edge ring 136) in at least one a positive or negative x-axis direction, a positive or negative y-axis direction, and/or a positive or negative yaw-axis direction (rotation) to properly orient and/or position the object (e.g., edge ring 136) to the corrected target orientation and/or to a corrected position at the aligner station 128. The alignment recipe may be associated with the transfer recipe for the object (e.g., edge ring 136). In response to aligning of the object (e.g., edge ring 136) at aligner station 128, factory interface robot 126 may then retrieve the object (e.g., edge ring 136) from the aligner station 128, the retrieved object (e.g., edge ring 136) having the corrected target orientation, and place the object into load lock 120b through a port 130 with the corrected orientation.

Transfer chamber robot 112 may remove object (e.g., edge ring 136) from load lock 120b through second vacuum port 130b. Transfer chamber robot 112 may move the object (e.g., edge ring 136) into the transfer chamber 110, where the object may be transferred to a destination station (e.g., processing chamber 114a, 114b, 116a, 116b, 118a, 118b). The object (e.g., edge ring 136) placed in the destination station (e.g., processing chamber 114a, 114b, 116a, 116b, 118a, 118b) may have the target orientation and/or the target position in destination station. Had the object been oriented to the initial target orientation in the aligner station 128, then the object would ultimately have had the characteristic error when placed at the destination station (e.g., processing chamber). However, since the object was orientated to the corrected target orientation in the aligner station (which may include the initial target orientation minus an angular adjustment corresponding to the characteristic error value), the object placed in the processing chamber has the target orientation in the processing chamber.

In embodiments, when the FI robot 126 places the object (e.g., edge ring 136) in the load lock 120b, the FI robot 126 nominally places the object at a first target location in the load lock using a taught position of a robot arm of the FI robot 126. The first target location may be at a center of the load lock, or may be at a location that is offset from the center of the load lock. A first pocket center of a first blade of the robot arm nominally corresponds to the first target location for the first taught position in embodiments. In embodiments, when the transfer chamber robot 112 picks up the object from the load lock 120b, the transfer chamber robot 126 uses a second taught position of a robot arm of the transfer chamber robot 126. A second pocket center of a blade of the transfer chamber robot arm nominally corresponds to the first target location for the second taught position.

In some instances, there is a misalignment or offset between the first taught position of the FI robot arm and the second taught position of the transfer chamber robot arm. A characteristic error value that represents the misalignment between the first taught position of the first robot arm and the second taught position of the second robot arm may be used to correct for the misalignment. For example, the FI robot 126 may place the object using the first taught position as modified by the characteristic error value. When the transfer chamber robot 112 picks up the object using the second taught position, the object will be positioned properly at a center of a pocket in the blade of the transfer chamber robot arm. Alternatively, the FI robot 126 may place the object using the first taught position, which may cause the object to be placed in the load lock 120b at a location that is offset from the target location in the load lock. The transfer chamber robot 112 may then use the second taught position as modified by the characteristic error value to pick up the object from the load lock. The object will then be positioned properly at a center of a pocket in the blade of the transfer chamber robot arm. Calibration of the FI robot 126 to transfer chamber robot 112 taught positions for transfer of objects through a load lock is discussed in greater detail below with reference to FIGS. 11-13.

While not shown for clarity in FIG. 1, transfer of edge ring 136 may occur while edge ring 136 is positioned on a carrier or adapter, and the end effectors (i.e. blades) of the robots may pick up and place the carrier or adapter that holds edge ring 136. This may enable an end effector that is configured for handling of wafers to be used to also handle edge ring 136.

Figure 2B:
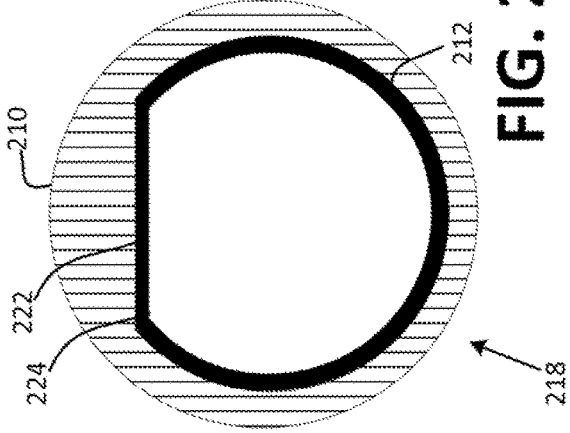
FIGS. 2A, 2B and 2C illustrate an example first orientation, an example target orientation and position, and an example first position of an object at a processing chamber, according to aspects of the present disclosure.
Figure 2C:
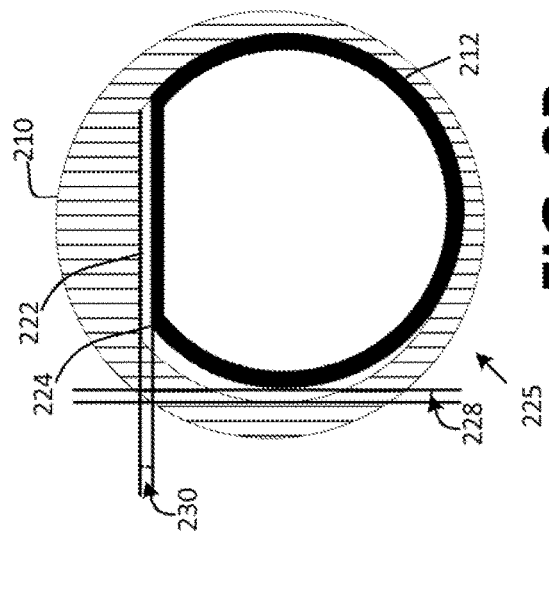
Figure 2A:
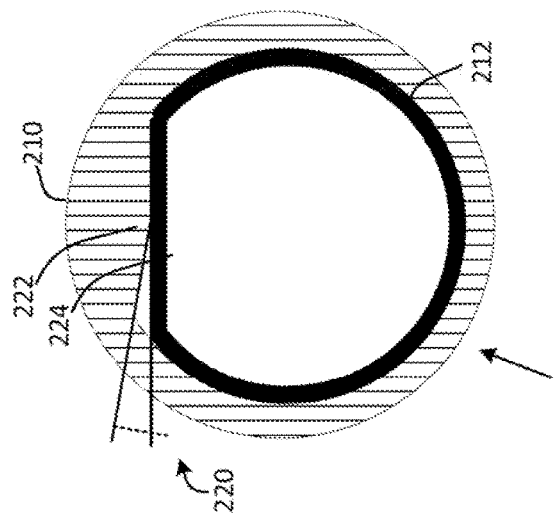

FIG. 2A illustrates an example first orientation and position 216 of an edge ring 210 at a processing chamber, according to aspects of the present disclosure. The processing chamber may correspond to at least one of processing chamber 114a, 114b, 116a, 116b, or 118a, 118b of electronics processing system 100 illustrated in FIG. 1. In some embodiments, the processing chamber may include a substrate support assembly 212 configured to support a substrate during a substrate process. Edge ring 210 may be configured for placement around the substrate support assembly 212. As discussed previously, edge ring 210 may be placed by a transfer chamber robot (not shown) at a first orientation and position 216 at substrate support assembly 212. In some embodiments, first orientation and position 216 may include an orientation error 220. Orientation error 220 may indicate a difference between an actual orientation and a target orientation of the edge ring (e.g., between an angle of a flat 222 of edge ring 210 relative to an angle of a flat 224 of the substrate support assembly 212). In embodiments, flat 222 is configured to mate with flat 224. The orientation error 220 may be caused by at least a first characteristic error value associated with the processing chamber. The first characteristic error may result from a variety of sources (e.g., error in robot angle and/or positioning, the processing chamber not being installed properly during construction of the processing system, etc.). Orientation error 220 may be determined based on an angle formed between a target orientation and an actual orientation. In one embodiment, the orientation error represents an angle between flat 222 and flat 224.

FIG. 2B illustrates an example second orientation and position 225 of the edge ring 210 at the processing chamber, according to aspects of the present disclosure. In some embodiments, second orientation 225 may include a positional error (also referred to as a translational error). The positional error may include a first positional error 228 along an x-axis and/or a second positional error 230 along a y-axis. The positional error may indicate a difference between an actual position and a target position of the edge ring. The first positional error 228 may be caused by a second characteristic error value in the y-direction and the second positional error 230 may be associated with a third characteristic error value in the x-direction. The characteristic errors may result from a variety of sources (e.g., error in robot angle and/or positioning, the processing chamber not being installed properly during construction of the processing system, etc.).

FIG. 2C illustrates an example third orientation and position 218 of the edge ring 210 at the processing chamber, according to aspects of the present disclosure. The third orientation and position 218 may be a correct orientation and position for placement of the edge ring around the substrate support. In some embodiments, third orientation and position 218 in the processing chamber may not include orientation error 220 (i.e., there is no difference between the angle of flat 222 and the angle of flat 224), first positional error 228 or second positional error 230.

In some embodiments, a processing chamber may be associated with the first characteristic error value, the second characteristic error value and/or the third characteristic error value.

In some embodiments, a transfer recipe may include a combination of characteristic error values, which may be summed to determine a total characteristic error associated with placing an edge ring in a processing chamber. The characteristic error values may include, for example, a first characteristic error associated with a processing chamber and a second characteristic error associated with at least another station of the electronics processing system (i.e., load lock 120, load port 124, etc.).

Figure 3B:
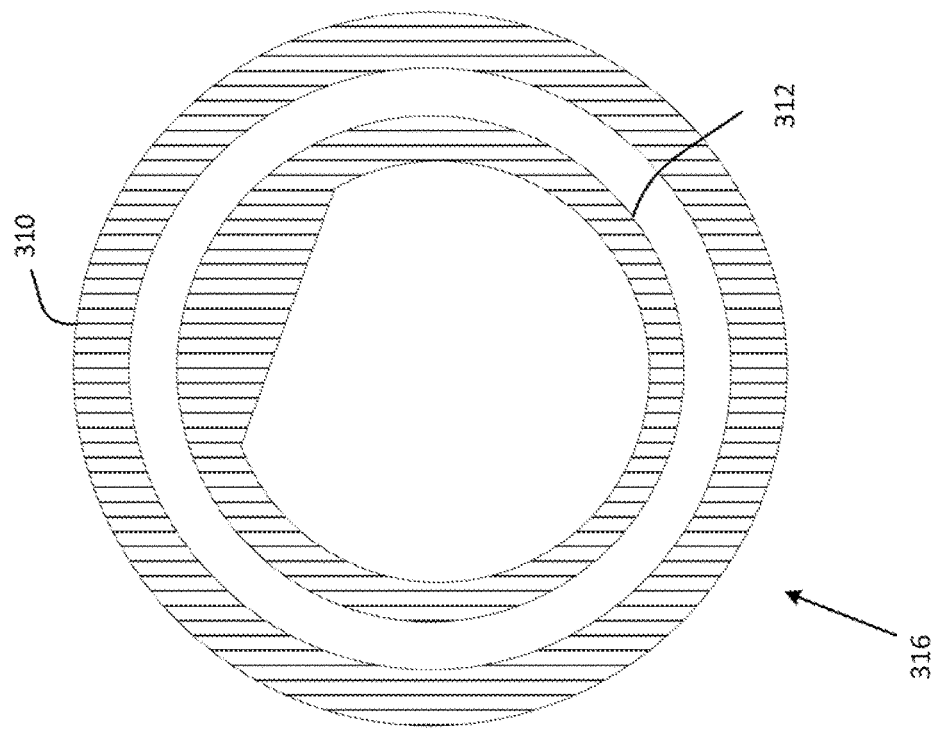
FIGS. 3A and 3B illustrate an example first orientation and an example initial target orientation of an object at an aligner of an electronics processing system, according to aspects of the present disclosure.
Figure 3A:
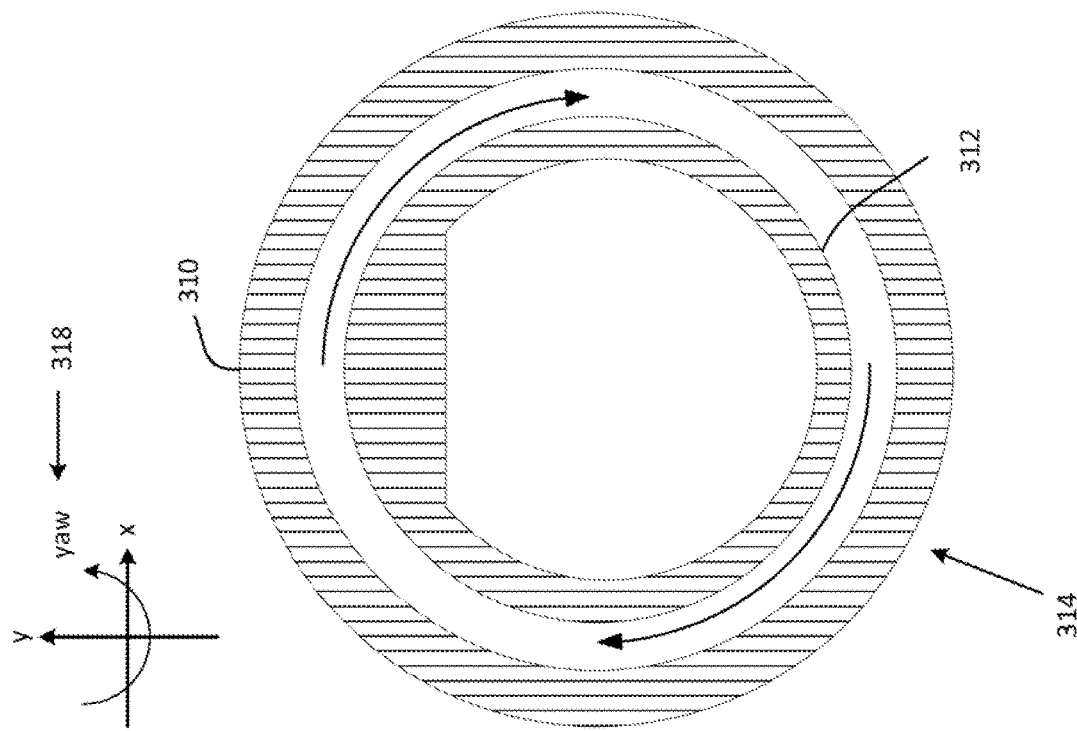

FIGS. 3A and 3B illustrate an example initial target orientation 314 and an example corrected target orientation 316 of an edge ring 312 at an aligner station 310 of an electronics processing system, according to aspects of the present disclosure. As discussed previously, edge ring 312 may ordinarily be aligned by aligner station to an initial target orientation 314. The edge ring 312 may initially have some angular error that may occur during placement of the edge ring in a container (e.g., FOUP), transport of the container, and/or attachment of the container to the factory interface. The aligner station may remove such error by aligning the edge ring 312 to the initial target orientation 314. The initial target orientation 314 in an example may include a flat of the edge ring 312 aligned perpendicular to a longitudinal axis of an end effector that picks up the edge ring 312 from the aligner station.

As discussed above, some characteristic error (e.g., angular error) may be introduced to the edge ring 312 by moving the edge ring from the aligner station to a destination processing chamber. Accordingly, the aligner station may intentionally introduce an inverse of the characteristic error into the orientation of the edge ring 312 during the alignment process. The initial target orientation as adjusted by the characteristic error may correspond to a corrected target orientation 316. Accordingly, by introducing the opposite of the characteristic error to the edge ring during alignment, that finally placed edge ring in the processing chamber will have no characteristic error because the intentionally introduced error will cancel out the characteristic error. In some embodiments, aligner 310 may rotate edge ring 312 along a yaw-axis 318 to position edge ring 312 at the corrected target orientation 316. In some embodiments, aligner 310 may position edge ring 312 at corrected target orientation 316 based on an alignment recipe stored at a controller, such as system controller 132 described with respect to FIG. 1.

As discussed above, stored characteristic errors are used during alignment of edge rings to intentionally introduce orientation error to the edge rings. Each processing chamber may have its own characteristic error, which may be different from the characteristic errors of other processing chambers. Additionally, each load lock may have its own characteristic error. Accordingly, an edge ring moved to a first processing chamber through a first load lock may have a different combined characteristic error than an edge ring moved to the first processing chamber through a second load lock. In order to determine the characteristic error values associated with each processing chamber (and/or each load lock or other station), a calibration procedure may be performed. The calibration procedure can be used to determine one or more characteristic error values associated with a transfer sequence between a source station and a destination station of the electronics processing system. Accordingly, the calibration procedure accounts for any errors caused by one or more stations and/or robots involved in the transfer sequence.

Though embodiments are described with reference to transferring objects between an aligner station and a processing chamber, the same calibration technique may be applied for calibration of a transfer sequence between any source and any destination in an electronics processing system. For example, calibration may be performed to determine any characteristic error associated with transferring an object from a first robot arm (of an FI robot or a transfer chamber robot), through a load lock, to a second robot arm (of the FI robot or the transfer chamber robot). In another example, calibration may be performed to determine any characteristic error associated with transferring an object from a FOUP, SSP or load port to a load lock by an FI robot, or vice versa.

Figure 4:
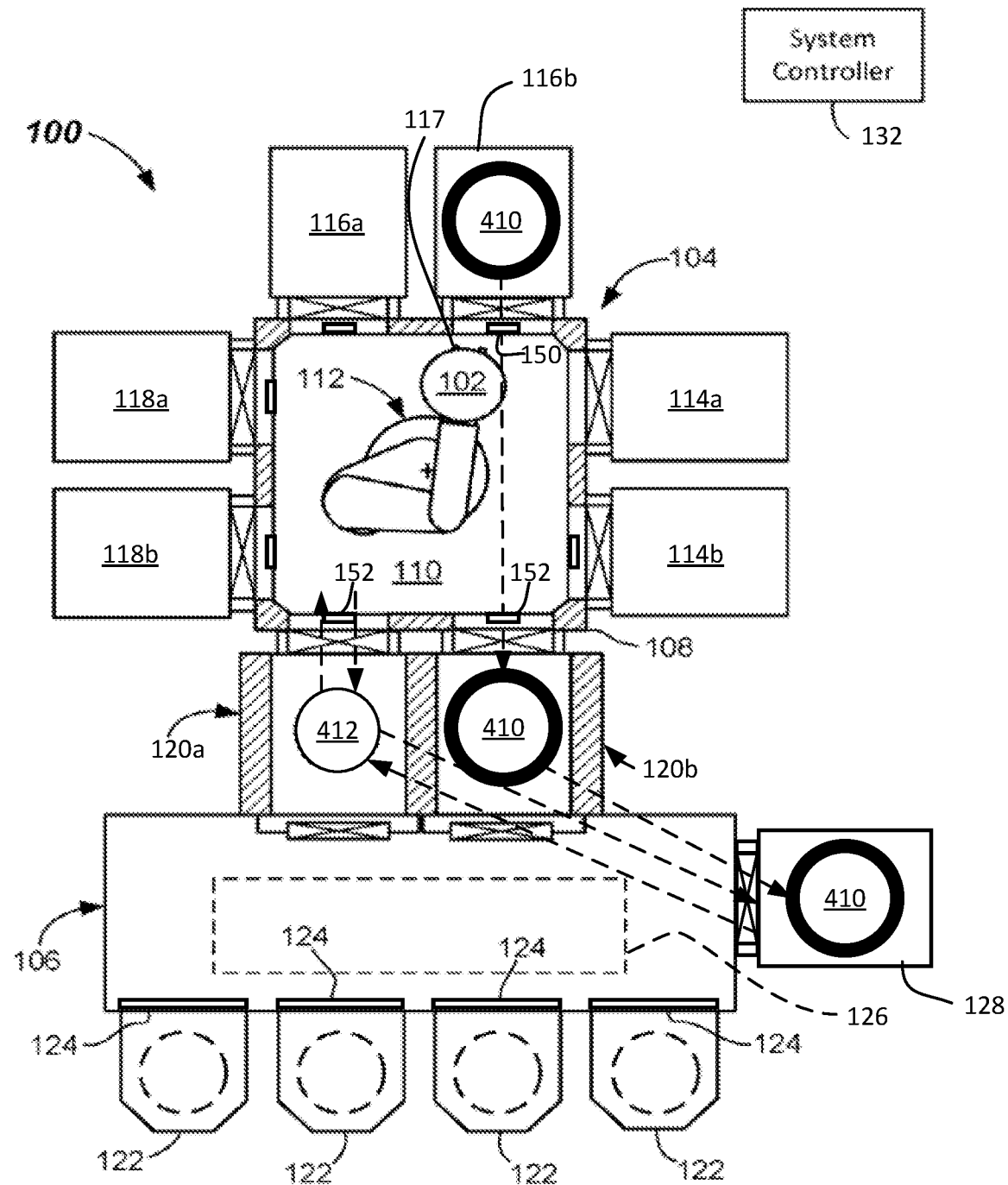
FIG. 4 illustrates a calibration of an aligner station of the example electronics processing system, according to aspects of the present disclosure

FIG. 4 illustrates a calibration of a transfer sequence for transferring an object (e.g., an edge ring, wafer or substrate) between a source station and a destination station, according to aspects of the present disclosure. An example is described for calibrating a transfer sequence between aligner station 128 and a processing chamber 116a, 116b via a load lock 120b. However, the same process may be used to calibrate a transfer sequence between any source and destination. Operations associated with FIG. 4 may be performed, for example, by processing logic of a controller.

A calibration object 410 may be placed at a target orientation and/or position at a processing chamber 114a, 114b, 116a, 116b, 118a, 118b of electronics processing system 100. A target orientation in the processing chamber may be an orientation of an object (i.e., calibration object 410, substrate 102, etc.) at processing chamber 114a, 114b, 116a, 116b, 118a, 118b that meets or exceeds a threshold degree of accuracy (i.e., includes an orientation error that exceeds a threshold orientation error). For example, the target orientation may be an orientation of the object that is within a 0.01° of accuracy, within 0.1° of accuracy, within 0.001° of accuracy, or within 0.02° of accuracy. Similarly, a target position in the processing system may be a position of an object that meets or exceeds a threshold degree of accuracy. The threshold degree of accuracy for the position may be the same as or different from the threshold degree of accuracy for the orientation. In some embodiments, the target orientation and/or position in the processing chamber may be the same as target orientation and position 218 described with respect to FIGS. 2A-2C.

In some embodiments, calibration object 410 may be at least one of a calibration ring, a calibration disc, or a calibration wafer. In some embodiments, calibration object 410 may be a standard edge ring or a standard substrate. A calibration ring may be a specially designed ring that is configured to fit around a substrate support assembly of the processing chamber 114a, 114b, 116a, 116b, 118a, 118b such that the calibration ring has a target orientation and/or position at the substrate support assembly to within a target degree of accuracy (e.g., 0.01° of accuracy). Similarly, a calibration wafer may be a specially designed wafer that is configured to fit within, on, over, or around the support assembly such that the calibration wafer has a target orientation and/or position at the substrate support assembly to within the target degree of accuracy or can determine an orientation and/or position of the wafer relative to the target orientation to within a target degree of accuracy.

In some embodiments, the substrate support assembly may include one or more coupling components (also referred to as registration features), such as lift pins. The registration features/coupling components are kinematic registration features in embodiments. The calibration object 410 may include one or more coupling receptacles that are configured to engage with the one or more registration features of the substrate support assembly. In some embodiments, the one or more coupling receptacles are kinematic coupling interfaces. In some embodiments, calibration object 410 may be placed at the substrate support assembly in processing chamber 114a, 114b, 116a, 116b, 118a, 118b by transfer chamber robot 112. Calibration object 410, when placed at the substrate support assembly, may have an orientation error and/or a positional error, such as orientation error 220 and/or positional errors 228, 230 described with respect to FIGS. 2A-2B. In response to calibration object 410 being placed at the substrate support assembly, one or more registration feature of the substrate support assembly may engage with a corresponding coupling receptacle (e.g., a corresponding kinematic coupling interface). By each registration feature engaging with a corresponding coupling receptacle, the orientation error and/or positional error associated with calibration object 410 may be removed and calibration object 410 may be positioned at the target orientation and/or the target position.

Many different designs of calibration object may be used in accordance with embodiments of the present disclosure. Such calibration objects in embodiments include a body sized to fit through a slit valve of the electronics processing system and designed to be transported by robot arms of the electronics processing system. For example, the calibration object may have a height and a width or diameter that fits through a slit valve. For example, for a 300 mm wafer processing system, slit valves may have a width of over 300 mm (e.g., 300 mm plus a clearance margin) and a height of about 10-50 mm. Accordingly, for such a system the calibration object may have a diameter of about 300 mm or less and a height of less than 10 mm to less than 50 mm in an embodiment. For a 450 mm wafer processing system, slit valves may have a width of over 450 mm and a height of about 10-50 mm. Accordingly, for such a system the calibration object may have a diameter of about 450 mm or less and a height of less than 10 mm to less than 50 mm in an embodiment. Some wafer processing systems may be configured to permit exchange of process kit rings through slit valves. For such wafer processing systems, the slit valves may have a width sufficient to accommodate a 15.25 inch diameter process kit ring (e.g., may have a width of over 15.25 inches, such as 15.25 inches plus a clearance margin). The body may be disc-shaped, ring-shaped, or have another shape. The calibration object may be directly picked and placed by robot arms, or may be disposed on a carrier or adapter that enables the carrier plus the calibration object supported by the carrier to be picked and placed by the robot arms. This enables the calibration object to be transferred between stations in the electronics processing system in an automated fashion without manual intervention by a user.

In some embodiments, the calibration object has a shape that is a negative of a region of a station at which the calibration object is designed to be placed for calibration purposes. For example, a bottom surface of the calibration object may have a shape that is a negative of an upper surface of a substrate support assembly. The calibration object in embodiments has enough lead-in to enable it to be placed at an initially incorrect position and/or orientation, and then automatically adjust to a correct position and/or orientation. Accordingly, the bottom surface of the calibration object may snugly mate with the upper surface of the substrate support assembly. This enables the calibration object to capture a characteristic orientation and/or position of a region in the station (e.g., of the substrate support of a processing chamber). That characteristic orientation and/or position may then be used for calibration purposes. While embodiments are discussed with reference to determining a characteristic position and/or orientation of a substrate support for placement of an edge ring in a process chamber, the calibration object may alternatively or additionally be configured to determine a characteristic position and/or orientation of a chuck, a plunger, a cathode, etc. in a processing chamber. Additionally, or alternatively, the calibration object may be configured to determine a characteristic position and/or orientation of a substrate support in a load lock, a load port, a FOUP, an SSP, or another station.

In embodiments, the calibration object has a body formed from a solid sintered ceramic (e.g., composed of $Al_2O_3$, AlN, $Y_2O_3$, $Y_3Al_5O_{12}$ (YAG), $ZrO_2$, or some other ceramic material). Accordingly, the calibration object may be usable at temperatures of up to 400 degrees C., up to 600 degrees C., or up to 800 degrees C. or more without damage to the calibration object. This enables the calibration object to be used to perform calibration and determine target positions and/or orientation of objects (e.g., substrates or edge rings) in processing chambers at process temperatures, which may be different from the target positions and/or orientations at room temperature. Accordingly, by designing the calibration objects to be usable at elevated process temperatures, an accuracy of a calibration performed using the calibration object may be improved. The calibration object is entirely composed of the solid sintered ceramic material in some embodiments. In other embodiments, the calibration object includes other components (which may also be heat resistant) that may be composed of different materials. For example, the calibration object may include slip-resistant buttons or pads disposed on a bottom surface of the calibration object. The slip-resistant buttons or pads may be composed of rubber, perfluoropolymer, or some other material. The slip-resistant buttons or pads may be positioned at points where the bottom surface of the calibration object contacts a blade of a robot arm and/or where the calibration object contacts a carrier or adapter. The slip-resistant buttons or pads prevent movement of the calibration object on a carrier or blade while it is transferred between stations.

In embodiments, the calibration object includes one or a plurality of kinematic coupling interfaces. The kinematic coupling interfaces may include contoured slopes that guide the calibration object to a target position and/or orientation when they engage with registration features at a station. In some embodiments, the calibration object includes three kinematic coupling interfaces. The kinematic coupling interfaces may provide up to a 0.5 mm, 1 mm, 2 mm, 3 mm, 4 mm, 5 mm, 6 mm, 7 mm, 10 mm or greater lead-in in embodiments. The lead-in represents an amount of initial orientation error (rotational error) and/or positional error that can be accommodated by the kinematic coupling interfaces and that the kinematic coupling interfaces can correct for when they engage with registration features at a station. The registration features may be fixed (static) registration features or movable (dynamic) registration features. An example of a fixed registration feature is a region on an exterior perimeter of a substrate support assembly, where the region has tight machine tolerances. Another example of a fixed registration feature is a series of fixed pins (e.g., three pins or wafer centering cones). In the example of the fixed pins, the kinematic registration interfaces may be a set of sloped slots (e.g., three slots) in an outer perimeter of the calibration object that line up with the fixed pins. In some embodiments, the kinematic coupling interfaces comply with Semi E57-0616.

In embodiments, the calibration object includes a fiducial. The fiducial is disposed at a side of the calibration object, and may be at an outer region (e.g., at or near a perimeter) of the calibration object or closer to a center of the calibration object. The fiducial may be a notch, groove, projection, flat, or other feature that is usable to determine an orientation of the calibration object.

Figure 5A:
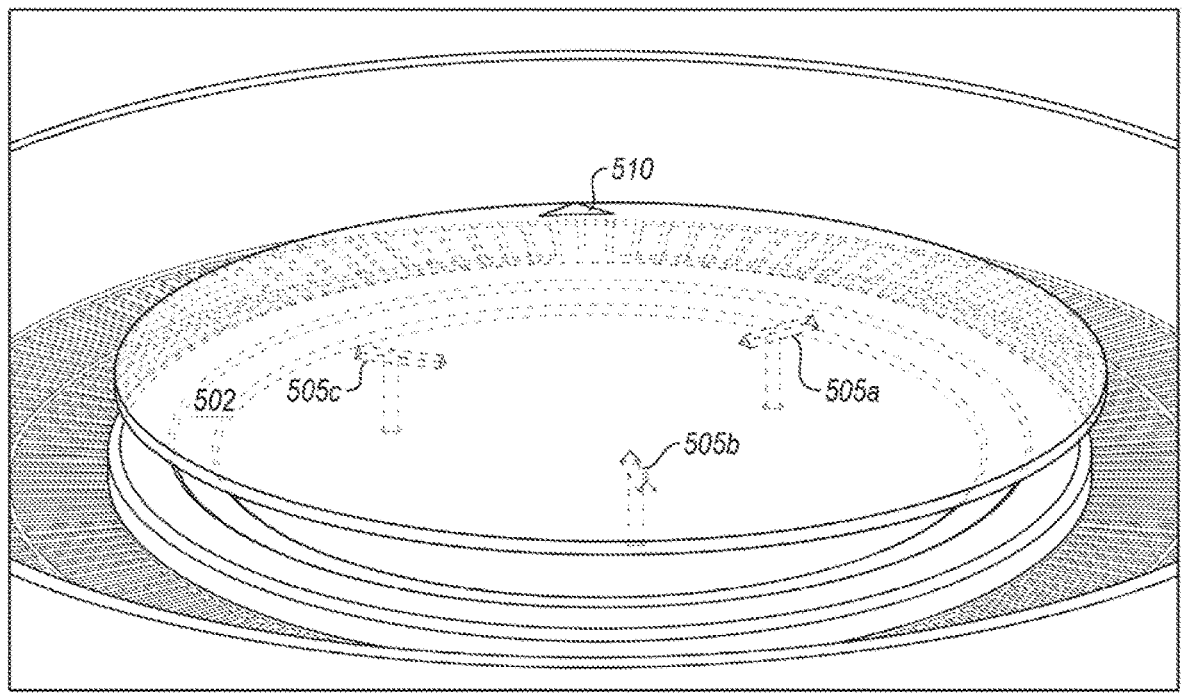
FIG. 5A illustrates an example calibration object, according to aspects of the present disclosure.

FIG. 5A illustrates an example calibration object 500, according to aspects of the present disclosure. As shown, the calibration object in one embodiment has a disc-shaped body 502. Alternatively, the body of the calibration object may have another shape, such as a ring shape. The disc-shaped body 502 includes a plurality of kinematic coupling interfaces 505a, 505b, 505c in the body 502. The plurality of kinematic coupling interfaces 505a-c are configured to engage with a respective plurality of registration features (e.g., lift pins) of a first station of the electronics processing system (e.g., of a processing chamber) and to guide the calibration object 500 to a target position and a target orientation at the first station. The body 502 additionally includes a fiducial 510 disposed at a side of the body (e.g., at a location on an outer perimeter of the body 502). The fiducial is usable to determine an orientation of the calibration object 500. The lift pins may lift to engage with the kinematic coupling interfaces 505a-505c. Such engagement of the kinematic coupling interfaces 505a-505c with the lift pins causes a position and/or orientation of the calibration object 500 to change to a target position and/or orientation.

Figure 5B:
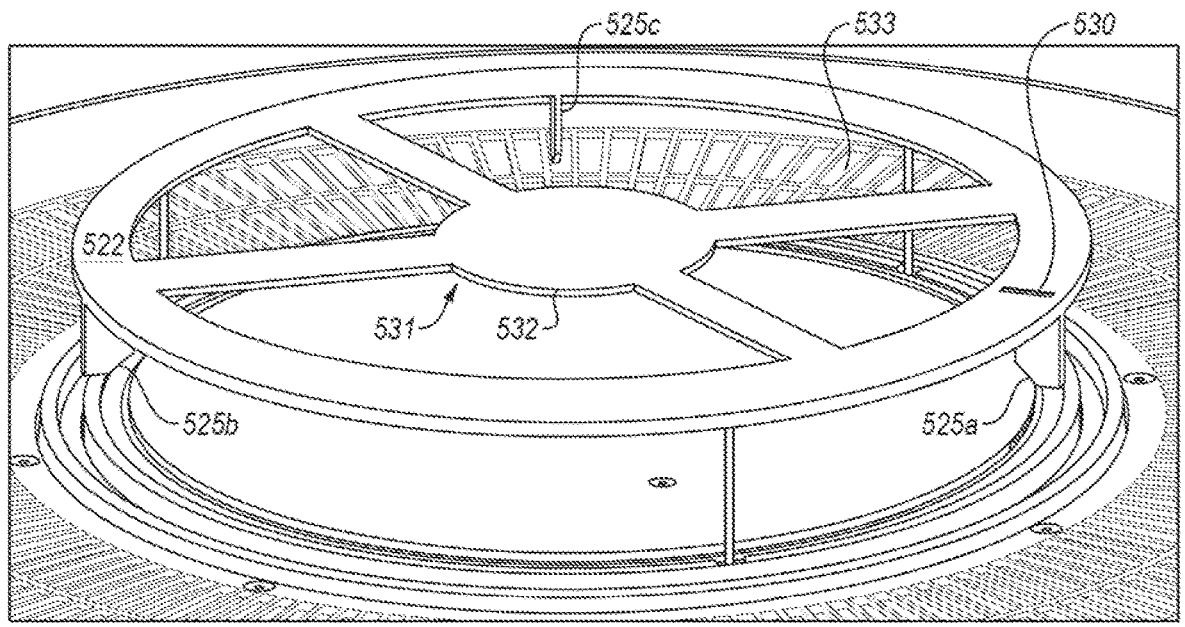
FIG. 5B illustrates an example calibration object, according to aspects of the present disclosure.

FIG. 5B illustrates an example calibration object 520, according to aspects of the present disclosure. As shown, the calibration object 520 in one embodiment has a ring-shaped body 522. Alternatively, the body of the calibration object may have another shape, such as a disc shape. The ring-shaped body 522 includes a plurality of kinematic coupling interfaces 525a, 525b, 525c in the body 522. In one embodiment, the plurality of kinematic coupling interfaces 525a-525c are legs that extend from a bottom of the body 522 at positions along a perimeter of the body 522. The plurality of kinematic coupling interfaces 525a-525c are configured to engage with a respective plurality of registration features of a first station of the electronics processing system (e.g., of a processing chamber) and to guide the calibration object 500 to a target position and a target orientation at the first station. One of the plurality of registration features may be a flat at a location on an outer perimeter of a substrate support.

In one embodiment, the kinematic coupling interfaces 525a-525c each include a curved or chamfered bottom that is configured to mate with a lip of the substrate support assembly of the station. In embodiments, the kinematic coupling interfaces 525a-525c include three kinematic coupling interfaces that provide 3-point locking to the outer perimeter of the substrate support assembly. The kinematic coupling interfaces 525a-525c engage with the registration features as the calibration object 520 is lowered onto a substrate support assembly of a station, causing a position and/or orientation of the calibration object 520 to change to a target position and/or orientation. Lift pins in the substrate support assembly may then be used to lift the calibration object 520 from the substrate support assembly without disturbing the position and/or orientation of the calibration object 520.

The body 522 of the calibration object additionally includes a fiducial 530 disposed at a side of the body (e.g., at a location on an inner region of the ring-shaped body 522). The fiducial is usable to determine an orientation of the calibration object 520. In embodiments, the calibration object 520 includes a support structure 531 that includes one or more beams 533 that connect to multiple positions on the ring-shaped body 522. The support structure 531 further includes a planar object 532 (e.g., a disc as illustrated) at or near a center of the ring-shaped body 522 and connected to the beam(s) 533. The support structure 531 may be configured to interface with a blade of a robot arm and/or with a carrier or adapter for a process kit ring.

FIGS. 5C-5D illustrate an example calibration object 540 on a substrate support 580 of a station, according to aspects of the present disclosure. FIG. 5C illustrates the full calibration object 540, while FIG. 5D shows half of the calibration object 540, where the calibration object 540 was cut along a line running through a center of the calibration object 540 in FIG. 5D. Calibration object 540 includes a disc-shaped ceramic body 542. The ceramic body 542 includes a left-side cutout 554a in a left side of the body and a right-side cutout 554b in a right side of the body 542. The left-side cutout 554a and the right-side cutout 554b are mirror images of one another (i.e., they are linearly symmetrical about a line running through the center of the body 542). In one embodiment, the left-side cutout 554a and the right-side cutout 554b are usable to detect an orientation of the calibration object based on a difference between a first position of a robot arm holding the calibration object at which the left-side cut-out is detected by a local center finder and a second position of the robot arm holding the calibration object at which the right-side cutout is detected by the local center finder.

In an embodiment, the calibration object 540 includes a plurality of arc-shaped cutouts 555 in the body that are offset from an outer perimeter of the body. The arc-shaped cutouts 555 may include the left-side cutout 554a and right-side cutout 554b. A first machine tolerance of at least one side of each of the arch-shaped cutouts is greater than a second machine tolerance of the outer perimeter of the body 542 in an embodiment. For example, the side of the arc-shaped cutouts that is nearest the perimeter of the body 542 may have tight machine tolerances, and may be used by an aligner station to determine runout and/or orientation of the calibration object 540 rather than the outer perimeter of the calibration object 540. Alternatively, the outer perimeter of the calibration object 540 may have tight machine tolerances and may be usable by the aligner station to determine orientation and/or runout of the calibration object.

In an embodiment, the body 542 includes a first plurality of kinematic coupling interfaces 560 and a second plurality of kinematic coupling interfaces 562 in the body 542. The first plurality of kinematic coupling interfaces 560 are configured to engage with a respective first plurality of registration features of a station of the electronics processing system and to guide the calibration object to an intermediate position and/or an intermediate orientation at the station. The second plurality of kinematic coupling interfaces are configured to engage with a respective second plurality of registration features of the station. As illustrated, the first plurality of kinematic coupling interfaces 560 are a plurality of recesses in a bottom surface of the body 542, and the second plurality of kinematic coupling interfaces 562 comprise a plurality of regions proximate to an outer perimeter of the body. In particular, the second plurality of kinematic coupling interfaces 562 are regions of the side of the arc-shaped cutouts 555 that is nearest the perimeter of the body 542. The first plurality of kinematic coupling interfaces have a first lead-in, and the second plurality of kinematic coupling interfaces have a second lead-in that is smaller than the first lead-in. The first plurality of kinematic coupling interfaces are configured to engage with a first plurality of kinematic registration features to guide the second plurality of kinematic coupling interfaces onto the second plurality of kinematic registration features (and partially correct an orientation error and/or positional error). The coupling of the second plurality of kinematic coupling interfaces with the second plurality of registration features then guides the calibration object to a final target orientation and/or target position.

Figure 5E:
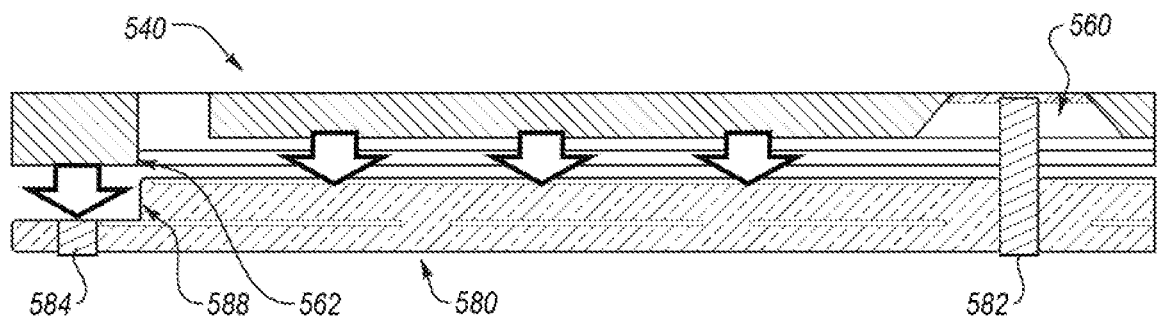
FIGS. 5E-5F illustrate placement of an example calibration object at a station, according to aspects of the present disclosure.
Figure 5F:
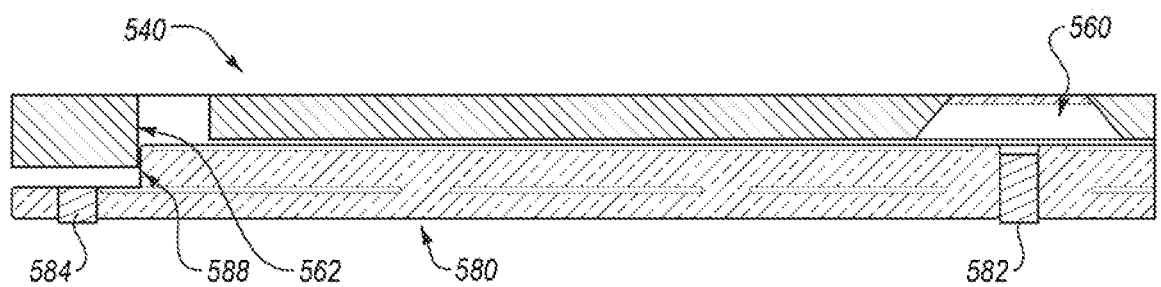

FIGS. 5E-5F illustrate placement of example calibration object 540 onto a substrate support 580 (e.g., a cathode of a substrate support) at a station, according to aspects of the present disclosure. In FIG. 5E, wafer lift pins 582 are extended, and engage with the first plurality of kinematic coupling interfaces 560 of calibration object 540, partially correcting an orientation and/or position of the calibration object 540. In FIG. 5F, the wafer lift pins 582 are lowered, and the second plurality of kinematic coupling interfaces 562 engage with an outer perimeter of a lip of the substrate support 580, completing correction of the orientation and/or position of the calibration object at the station. The two sets of kinematic coupling interfaces and corresponding registration features are used to increase an amount of correction in orientation error and/or positional error that can be achieved by the calibration object. The kinematic coupling interfaces 560 may correct for gross errors, and the kinematic coupling interfaces 562 may correct for fine errors in an embodiment.

Figure 5G:
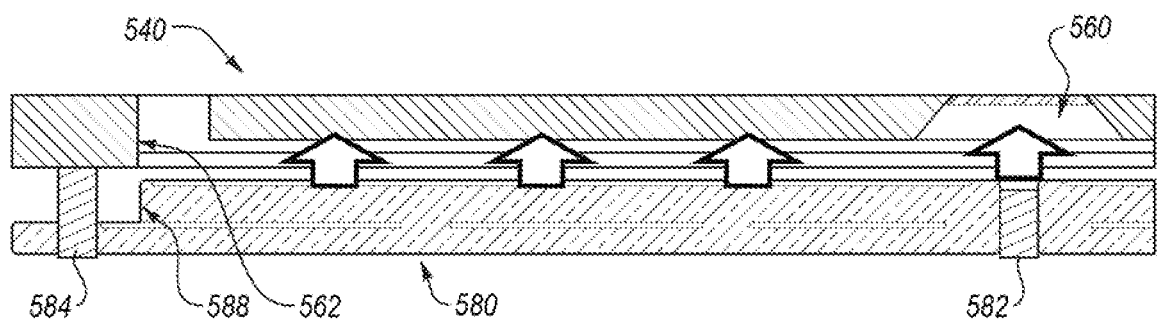
FIG. 5G illustrates removal of the example calibration object from the station of FIGS. 5A-5B, according to aspects of the present disclosure.

FIG. 5G illustrates removal of the example calibration object 540 from the station of FIGS. 5A-5B, according to aspects of the present disclosure. A separate set of lift pins (e.g., edge ring lift pins 584) are used to lift the calibration object 540 off of the cathode 580 without disturbing the orientation or x-y position of the calibration object so that it can be retrieved by a blade of a robot arm.

Returning to FIG. 4, after the calibration object 410 is placed at the target orientation and/or target position at a processing chamber 114a, 114b, 116a, 116b, 118a, 118b, calibration object 410 may be retrieved, by transfer chamber robot 112, from processing chamber 114a, 114b, 116a, 116b, 118a, 118b and placed in a load lock 120 connected to transfer chamber 110. Factory interface robot 126 may retrieve calibration object 410 from load lock 120 and place calibration object 410 at aligner station 128. Calibration object 410 may be placed at aligner station 128 at a first orientation and/or a first position. The first orientation may include a first characteristic error associated with the processing chamber. Optionally, the first position may include one or more additional characteristic errors (e.g., an x-position characteristic error and/or a y-position characteristic error). For example, the first orientation may include an inverse of a characteristic error that would be introduced with an edge ring that was aligned to an initial target orientation at the aligner station 128 and then moved to the processing chamber.

In response to calibration object 410 being placed at aligner station 128, the first orientation of the calibration object 410 at the aligner station 128 may be determined. Additionally, in some implementations a difference between the first orientation and an initial target orientation at the aligner station is determined. The initial target orientation at the aligner may be an orientation of an object (i.e., calibration object 410, substrate 102) where, in response to the object being transferred from aligner station 128 to a processing chamber 114a, 114b, 116a, 116b, 118a, 118b, the object should nominally be placed at a target orientation upon receipt at processing chamber 114a, 114b, 116a, 116b, 118a, 118b. However, the characteristic error causes the objects that are oriented to the initial target orientation at the aligner station to not have the target orientation at the processing chamber, and to instead have a characteristic error.

The first orientation and/or the difference between the first orientation and the initial target orientation may indicate a first characteristic error value associated with processing chamber 114a, 114b, 116a, 116b, 118a, 118b (or an inverse of the characteristic error value associated with the processing chamber 114a, 114b, 116a, 116b, 118a, 118b). The characteristic error value may be associated with a particular transfer sequence between a source station (e.g., the aligner station) and a destination station (e.g., a processing chamber). The characteristic error value may quantify a characteristic orientation error associated with moving objects from the source station to the destination station (e.g., to processing chamber 114a, 114b, 116a, 116b, 118a, 118b). The characteristic error value may be recorded in a storage medium (i.e., a data storage device of system controller 132). In some embodiments, the characteristic error value may be retrieved from the storage medium and used by system controller 132 for alignment of objects to be placed at a destination station (e.g., processing chamber 114a, 114b, 116a, 116b, 118a, 118b) associated with the characteristic error value, as discussed above.

As discussed above, one common destination station is at a processing chamber. However, embodiments are not limited to processing chambers as destination stations. In addition to determining the characteristic error value associated with a processing chamber 114a, 114b, 116a, 116b, 118a, 118b, a characteristic error associated with one or more other stations (i.e., load lock 120, load port 124, etc.) of the electronics processing system may be determined. For example, calibration object 410 may aligned to a target orientation in a load lock, retrieved, by factory interface robot 126, placed at a second orientation at aligner station 128. The calibration object may include a plurality of kinematic coupling interfaces having shapes and locations on the body of the calibration object to interface with registration features in the load lock. For example, load locks often include wafer lift pins. The calibration object in embodiments includes kinematic coupling interfaces to engage with wafer lift pins in load locks of the electronics processing system.

The second orientation may be determined. Additionally, a difference between the second orientation and an initial target orientation may be determined. The second orientation and/or the difference may indicate an orientation error caused by a first characteristic error value of load lock 120. The characteristic error value associated with the load lock may be recorded in the storage medium. In some embodiments, the characteristic error value previously described and the characteristic error value of the load lock may be retrieved from the storage medium and used by system controller 132 for alignment of objects placed at load lock 120 and subsequently placed at processing chamber 114a, 114b, 116a, 116b, 118a, 118b. The same (and/or a similar) process may be performed in order to determine a characteristic error value associated with load port 124, an SSP and/or a cassette (e.g., a FOUP). In some embodiments, a single load lock is used for transfer of edge rings to processing chambers. Accordingly, in such embodiments the characteristic error value associated with a processing chamber may also include in it any characteristic error value caused by the single load lock.

In some embodiments, a single calibration object is configured for calibration of multiple different types of stations (e.g., for calibration of wafer transfer sequences to particular types of destination stations). For example, a single calibration object may be configured for calibration of both load locks and processing chambers. The calibration object may include first kinematic coupling interfaces for engaging with registration features of load locks and second kinematic coupling interfaces for engaging with registration features of processing chambers. In one embodiment, a calibration object may be aligned to a first orientation for placement into a first type of destination station (e.g., a load lock) and may be aligned to a second orientation for placement into a second type of destination station (e.g., a processing chamber). In some embodiments, different calibration objects are used for calibration of different types of stations (e.g., for calibration of wafer transfer sequences to different types of destination stations).

After calibrating a wafer transfer sequence between a source station and a destination station, an object (e.g., an edge ring) aligned at aligner station 128 may initially have a corrected target alignment at the source station, may be transferred to a destination station (e.g., processing chamber 114a, 114b, 116a, 116b, 118a, 118b), and may have a target orientation at the processing chamber to a high degree of accuracy. In some embodiments, the object may be a process kit ring. The process kit ring may be retrieved by factory interface robot 126 from a storage location, such as a substrate carrier 122 (e.g., FOUP) or SSP. The process kit ring may be placed by factory interface robot 126 at aligner station 128. In some embodiments, it may be determined that the process kit ring is to be placed at a particular processing chamber 114a, 114b, 116a, 116b, 118a, 118b (e.g., according to a particular transfer sequence or recipe). For example, it may be determined that the process kit ring is to be placed at processing chamber 116b. In additional embodiments, it may be determined that the process kit ring, prior to being placed at processing chamber 116b, is to be placed at a particular load lock 120b. In response to determining that process kit ring is to be placed at processing chamber 116b and optionally a particular load lock 120b, a first characteristic error value associated with processing chamber 116b and/or a second characteristic error value associated with load lock 120b may be retrieved from the storage medium. The process kit ring may be aligned, using at least the first characteristic error value (and optionally the second characteristic error value), to a corrected target orientation. Additionally, further characteristic error value(s) associated with the processing chamber and/or load lock may also be used (e.g., characteristic error values associated with correction of positional errors). The corrected target orientation may be based on the initial target orientation as adjusted by at least the first characteristic error value and/or the second characteristic error value. Additionally, or alternatively, a corrected target position may be based on the initial target position as adjusted by at least one or more additional characteristic error values associated with positional errors. In response to the process kit ring being aligned to the corrected target orientation and/or target position, the process kit ring may be retrieved from aligner station 128 and placed at load lock 120b by factory interface robot 126. In some embodiments, to correct for orientation errors the edge ring is orientated to the adjusted initial target position by the aligner station, and to correct for positional errors the robot is picked up by the FI robot such that it is off center relative to a pocket center of a blade of the FI robot. The process kit ring may then be retrieved from load lock 120b and placed at processing chamber 116b by transfer chamber robot 112. In some embodiments, the process kit ring may be placed at processing chamber 116b at a target orientation within a degree of accuracy between approximately 0.2° and 0.0000001° and/or a target position to within a degree of accuracy between approximately 0.1° and 0.01°. In some embodiments, the process kit ring may be placed at processing chamber 116b at a target orientation within a degree of accuracy between approximately 0.001° and 0.00001°.

In some embodiments, one or more distinct characteristic error value may be determined for each processing chamber 114a, 114b, 116a, 116b, 118a, 118b, in accordance with embodiments described above. For example, the first characteristic error value may be associated with processing chamber 116b, a second characteristic error value may be associated with processing chamber 116a, a third characteristic error value may be associated with processing chamber 114a, and so on.

FIG. 4 has been described with reference to calibrating a transfer sequence between a source station and a destination station. In particular, embodiments have been described with reference to calibrating the transfer sequence to accommodate a unique target position and/or orientation associated with the destination station. In other embodiments, a transfer sequence between the FI robot 126 and the transfer chamber robot 112 via a load lock (e.g., load lock 120a) may be calibrated. Such a calibration may be performed by placing, by a first robot arm of the transfer chamber robot 112 or the FI robot 126, a calibration object 412 into a load lock 120a that separates the factory interface 106 from the transfer chamber 110. The calibration object is placed into the load lock such that a calibration object center is at a first target location associated with a first taught position of the first robot arm. A first pocket center of a first blade of the first robot arm nominally corresponds to the first target location for the first taught position. A second robot arm of the FI robot 126 or the transfer chamber robot 112 retrieves the calibration object from the load lock 120a onto a second blade of the second robot arm using a second taught position of the second robot arm. A second pocket center of the second blade nominally corresponds to the first target location for the second taught position. However, the calibration object center may be offset from the second pocket center by a first offset amount after retrieving the calibration object.

In one embodiment, the first robot arm is a robot arm of the FI robot 126 and the second robot arm is a robot arm of the transfer chamber robot 112. In another embodiment, the first robot arm is a robot arm of the transfer chamber robot 112 and the second robot arm is a robot arm of the FI robot 126.

A sensor that is in or connected to a) the factory interface if the second robot arm is on the FI robot or b) the transfer chamber if the second robot arm is on the transfer chamber robot 112 is used to determine the first offset amount between the calibration object center and the second pocket center. If the second robot arm is on the FI robot 126, then the FI robot 126 places the calibration object 412 at the aligner station 128. The aligner station 128 can then determine a runout of the calibration object positioned on a substrate support of the aligner station, and from the runout can determine the offset. The offset may include a first offset in a y-direction and/or a second offset in an x-direction. In some embodiments, additional LCFs (not shown) are placed at the interfaces between the load locks 120a, 120b and the FI 106. In such embodiments, these LCFs may be used to determine the offset without use of the aligner station 128. If the second robot arm is on the transfer chamber robot 112, then the LCF 152 associated with the load lock 120a is used to determine the offset. The system controller 132 then determines a first characteristic error value that represents a misalignment between the first taught position of the first robot arm and the second taught position of the second robot arm based on the first offset amount. The first characteristic error value may include a pair of characteristic error vales, where one characteristic error value is associated with offset in the x-direction and another characteristic error value is associated with offset in the y-direction. System controller 132 then records the first characteristic error value in a storage medium. One of the first robot arm or the second robot arm then uses the first characteristic error value to compensate for the misalignment for objects (e.g., substrates, edge rings, etc.) transferred between the first robot arm and the second robot arm via the load lock 120a. For example, the FI robot 126 may adjust the first taught position by a negative of the characteristic error value when placing an object into load lock 120a. The transfer chamber robot 112 may then pick up the object using the second taught position, without modification. Alternatively, the FI robot may place the object in the load lock 120a using the first taught position. The transfer chamber robot 112 may then use the second taught position as modified by the characteristic error value to pick up the object from the load lock 120a. In either case, the picked up object does not have the characteristic error on the blade of the transfer chamber robot arm.

FIGS. 6-13 are flow diagrams of various embodiments of methods 600-1300 for calibrating components and/or a transfer sequence of an electronics processing system and/or for transferring objects between components of the electronics processing system using characteristic error values determined from calibration. The methods are performed by processing logic that may include hardware (circuitry, dedicated logic, etc.), software (such as is run on a general purpose computer system or a dedicated machine), firmware, or some combination thereof. Some operations of methods 600-1300 may be performed by or initiated by a computing device, such as system controller 132 of FIG. 1.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

Figure 6:
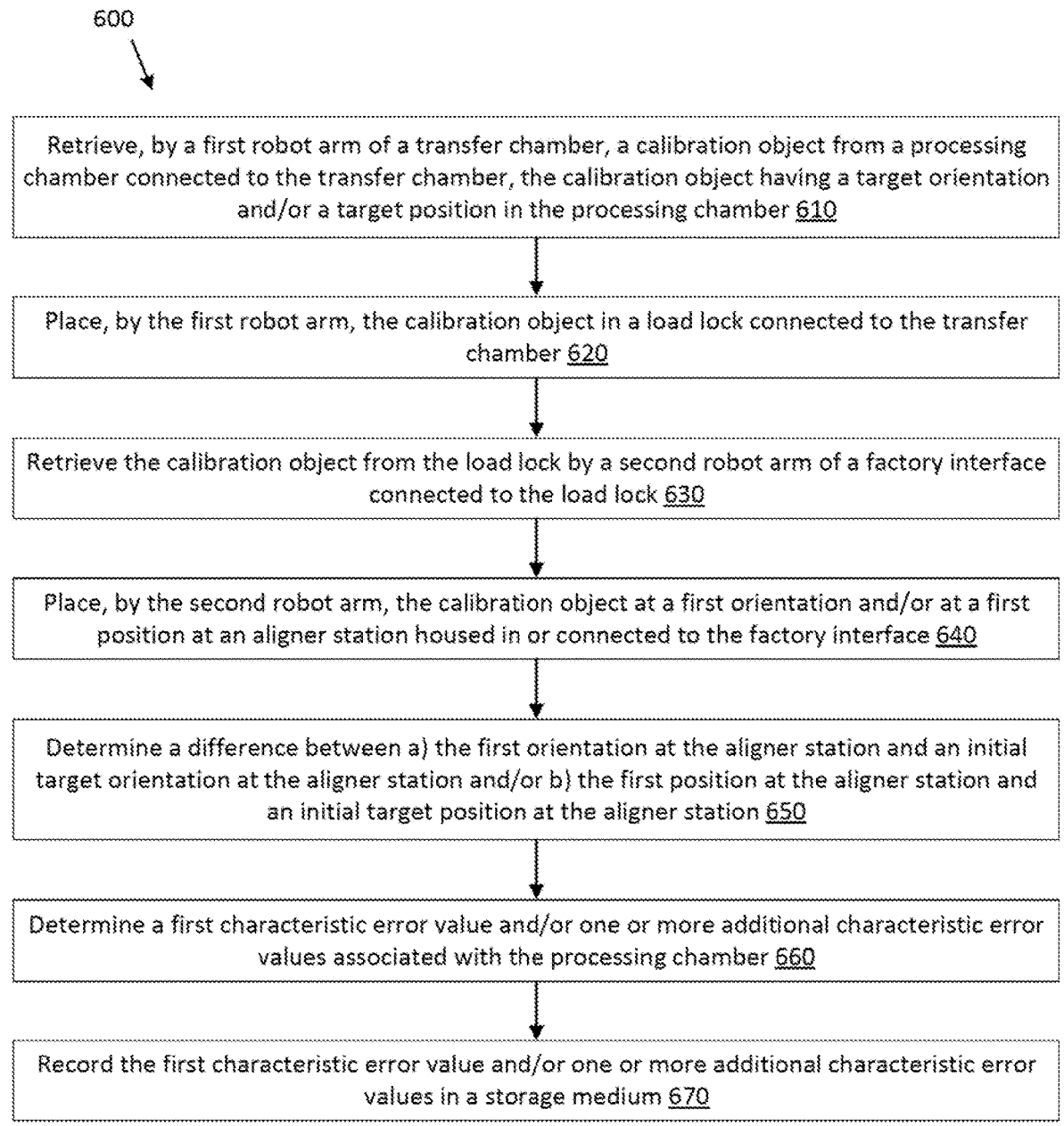
FIG. 6 is flow chart for a method of calibrating a transfer sequence of an object between an aligner station and a processing chamber of an electronic processing system, according to embodiments of the present disclosure.

FIG. 6 is a flow chart of a method 600 for calibrating a transfer sequence between a source station and a destination station of an electronics processing system, according to embodiments of the present disclosure. At block 610, a calibration object is retrieved, by a first robot arm of a transfer chamber, from a first station (e.g., a processing chamber) connected to the transfer chamber. The calibration object may have been placed in the processing chamber by the robot arm, and may have a target orientation and/or position in the processing chamber. In some embodiments, the calibration object may be at least one of a calibration ring, a calibration wafer, or a calibration disc. At block 620, the calibration object is placed, by the first robot arm, in a load lock connected to the transfer chamber. At block 630, the calibration object is retrieved from the load lock by a second robot arm of a factory interface connected to the load lock.

At block 640, the calibration object is placed, by the second robot arm, at a first orientation and/or position at an aligner station housed in or connected to the factory interface. At block 650, the first orientation at the aligner station is determined. Additionally, a difference between the first orientation at the aligner station and an initial target orientation at the aligner station is determined. A difference between a first position and an initial target position may also be determined. At block 660, one or more characteristic error values associated with the processing chamber are determined. At block 670, the one or more characteristic error values are recorded in a storage medium. In response to an object being received at the aligner station to be placed at the processing chamber, the characteristic error value(s) may be received from the storage medium. The aligner station and/or FI robot may move the object to be positioned at the target orientation based on the characteristic error value(s).

Figure 7A:
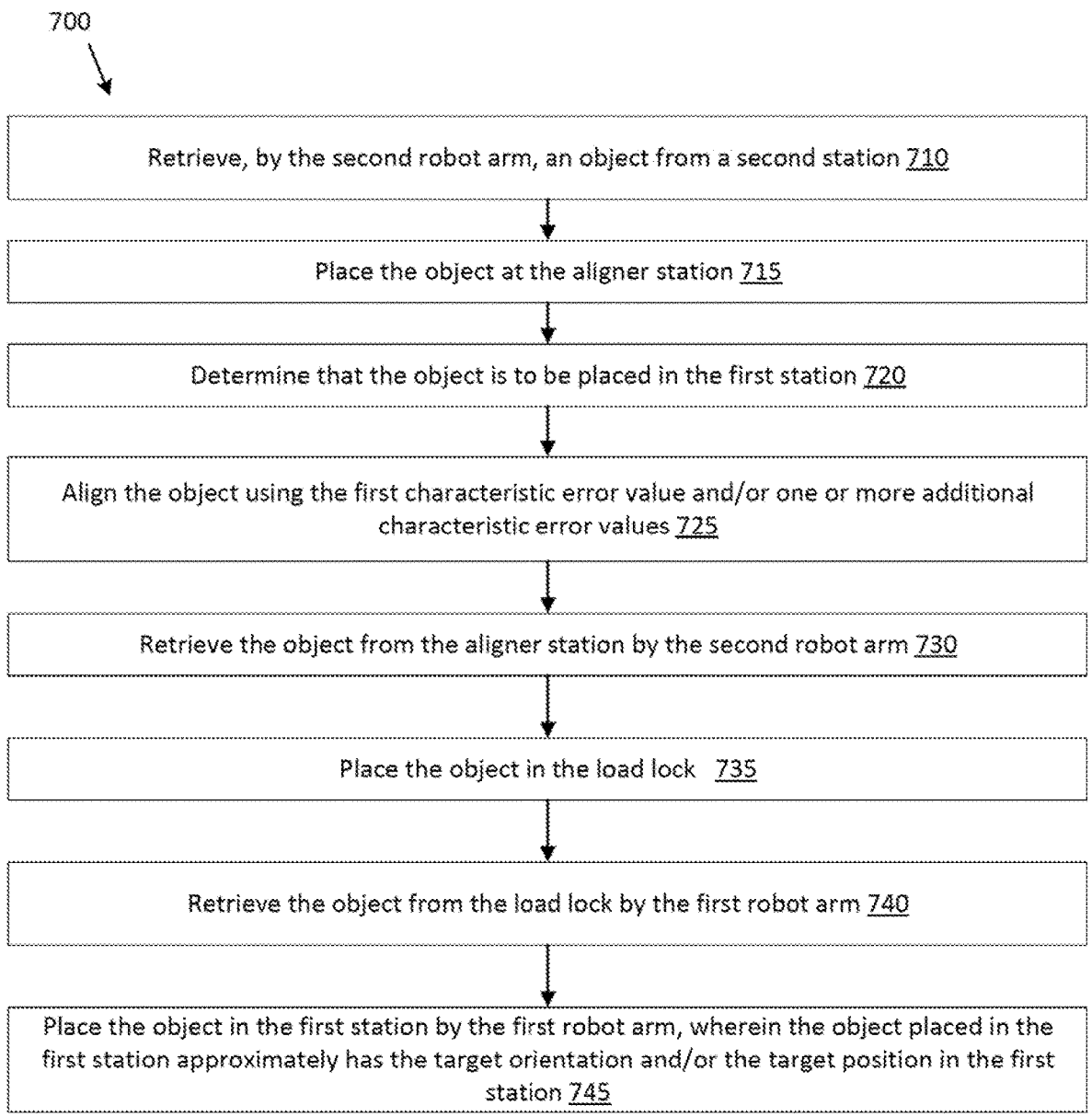
FIG. 7A is flow chart for a method of using a calibrated transfer sequence to transfer an object between an aligner station and a processing chamber of an electronic processing system, according to embodiments of the present disclosure.

FIG. 7A is a flow chart of a method 700 for placing an object such as a process kit ring at a target orientation and/or a target position at a destination station based on one or more determined characteristic error values associated with a transfer sequence between a source station and the destination station, according to embodiments of the present disclosure. Method 700 may be performed after the calibration method 600 is performed. At block 710, a system controller causes the second robot arm (as introduced in FIG. 6) to retrieve an object (e.g., an edge ring, a cover wafer, a substrate, etc.) from a second station. The second station may be an SSP or a cassette such as a FOUP. At block 715, the system controller causes the second robot arm to place the object at the aligner station. At block 720, the system controller determines that the object is to be placed at the first station (e.g., the processing chamber).

At block 725, the system controller causes the aligner station to align the object using the first characteristic error value and optionally using one or more additional characteristic error values. The aligner station may align the object to a corrected target orientation that is based on the initial target orientation as adjusted by the first characteristic error value and/or to a corrected target position that is based on the initial target position as adjusted by the one or more one or more additional characteristic error values. At block 730, the system controller causes the second robot arm to retrieve the object from the aligner station. In some embodiments, the one or more additional characteristic error values are used to adjust a positioning of the blade of the second robot arm during retrieval of the aligned object. For example, in embodiments the aligner station may not be able to adjust an x or y position of the object. However, the second robot arm may pick up the object such that the object is off center from a pocket of the blade of the second robot arm. The one or more additional characteristic error values may be used to determine how far off center to cause the object to be in the x and/or y directions.

At block 735, the system controller causes the second robot arm to place the object in the load lock that was used during calibration. At block 740, the system controller causes the first robot arm (as introduced in FIG. 6) to retrieve the object from the load lock. At block 745, the system controller causes the first robot arm to place the object in the first station (e.g., the processing chamber). The object placed in the first station has (or approximately has) the target orientation and/or the target position in the first station.

Figure 7B:
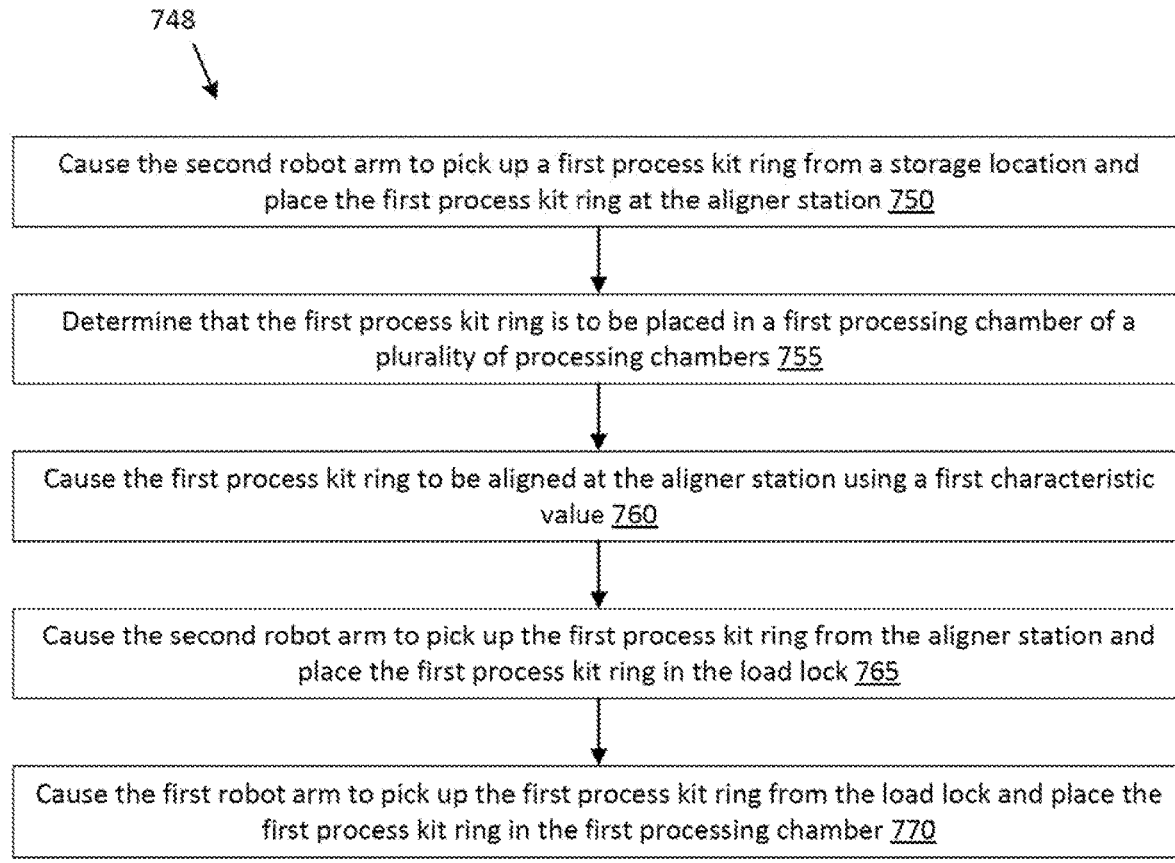
FIG. 7B is flow chart for a method of using a calibrated transfer sequence to transfer an object between an aligner station and a processing chamber of an electronic processing system, according to embodiments of the present disclosure.

FIG. 7B depicts a method 748 for placing an object such as a process kit ring at a target orientation at a processing chamber based on a determined characteristic error value associated with the processing chamber, according to embodiments of the present disclosure. At block 750, a controller operatively coupled to a first robot arm, a second robot arm, and an aligner station may cause the second robot arm to pick up a first process kit ring from a storage location and place the first process kit ring at the aligner station. At block 755, it may be determined that the first process kit ring is to be placed in a first processing chamber of a plurality of processing chambers.

At block 760, the controller causes the first process kit to be aligned, at the aligner station, using a first characteristic error value. The first characteristic error value may be associated with the first processing chamber, in accordance with previously described embodiments. The aligner station may align the first process kit ring to a corrected target orientation that is based on the initial target orientation as adjusted by the first characteristic error value.

At block 765, the controller causes the second robot arm to pick up the first process kit ring from the aligner station and place the first process kit ring in the load lock. At block 770, the controller causes the first robot arm to pick up the first process kit ring from the load lock and place the first process kit ring in the first processing chamber. The first process kit ring may be placed in the first processing chamber at (or approximately at) a target orientation in the first processing chamber. For example, the process kit ring may be placed at the target orientation plus or minus an error of as little as 0.2° to as little as 0.01°.

Figure 8:
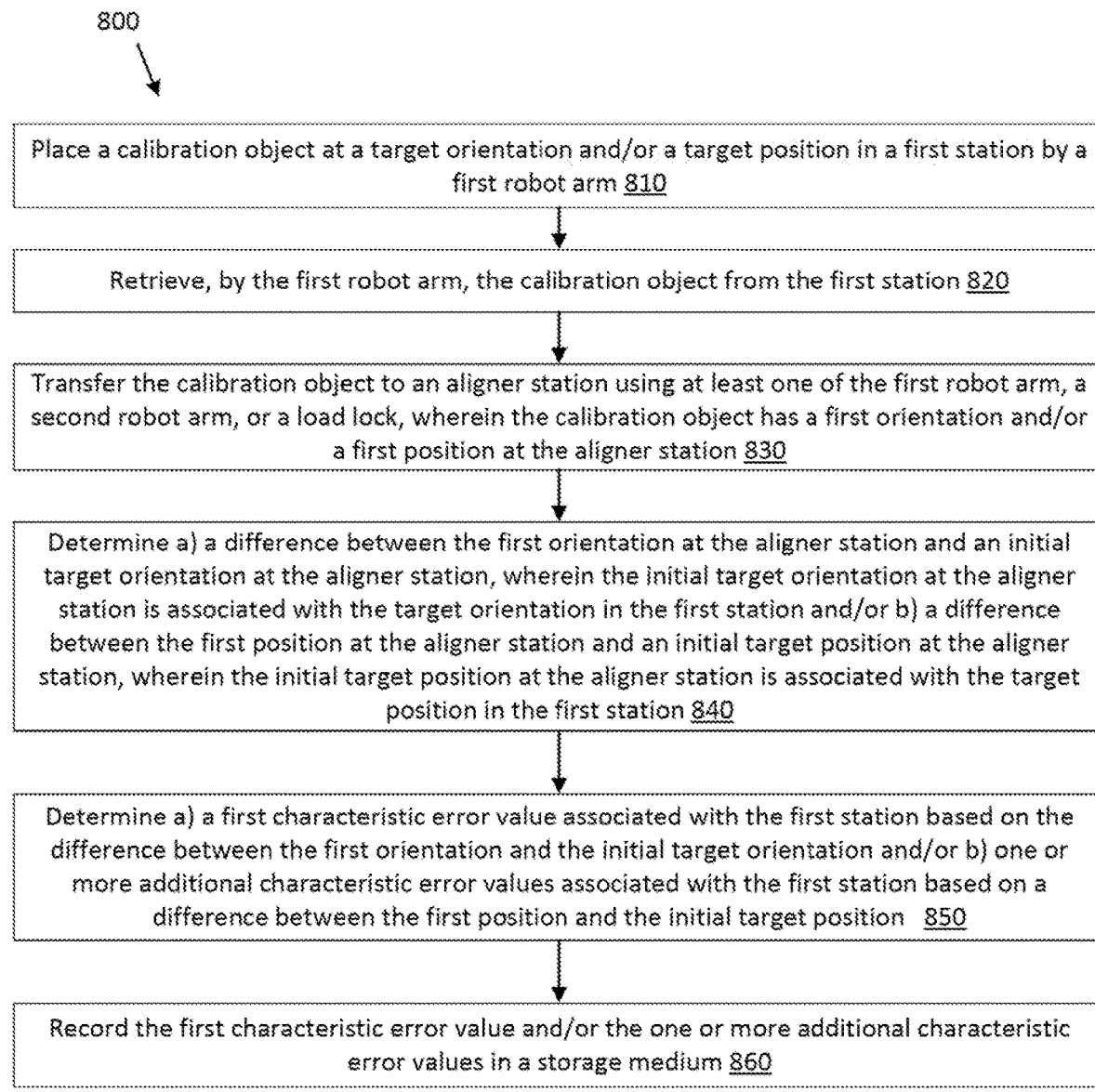
FIG. 8 is flow chart for a method of calibrating a transfer sequence of an object between an aligner station and an additional station of an electronic processing system, according to embodiments of the present disclosure.

FIG. 8 is a flow chart for a method 800 of calibrating a transfer sequence between a source station and a destination station of an electronics processing system, according to embodiments of the present disclosure. Method 800 is similar to method 600, except that in method 800 the source station and the destination station may both be attached to or accessible from the FI or the transfer chamber, or one station may be attached to and/or accessible from the FI and the other station may be attached to and/or accessible from the transfer chamber. At block 810 of method 800, a system controller causes a first robot arm to place a calibration object at a target orientation and/or at a target position in a first station. The calibration object may be any of the aforementioned calibration objects. The act of placing the calibration object onto the first station may cause it to become aligned and positioned at the target orientation and/or the target position. At block 820, the system controller causes the first robot arm to retrieve the calibration object from the first station without disturbing the orientation and/or position that was achieved during placement of the calibration object at the first station.

At block 830, the system controller causes the calibration object to be transferred to an aligner station. If the first station was at or connected to the FI, then the first robot arm places the calibration object in the aligner station, which is connected to or in the FI. If the first station was at or connected to the transfer chamber, then the first robot arm places the calibration object in a load lock, a second robot arm in the FI retrieves the calibration object from the load lock, and the second robot arm places the calibration object in the aligner station.

At block 840, the system controller uses the aligner station to determine the first orientation at the aligner station. Additionally, the system controller may use the aligner station to determine a difference between the first orientation at the aligner station and an initial target orientation at the aligner station. The initial target orientation at the aligner station is associated with the target orientation in the first station. Additionally, or alternatively, the system controller determines a difference between the first position at the aligner station and an initial target position at the aligner station. The initial target position at the aligner station is associated with the target position in the first station.

At block 850, the system controller determines a first characteristic error value associated with the first station based on the first orientation. In some embodiments, the first characteristic error value is determined based on the difference between the first orientation and the initial target orientation. Additionally or alternatively, the system controller determines one or more additional characteristic error values (e.g., a characteristic error value in the x-direction and a characteristic error value in the y-direction) associated with the first station based on a difference between the first position and the initial target position. At block 860, the system controller records the first characteristic error value and/or the one or more additional characteristic error values in a storage medium.

Figure 9:
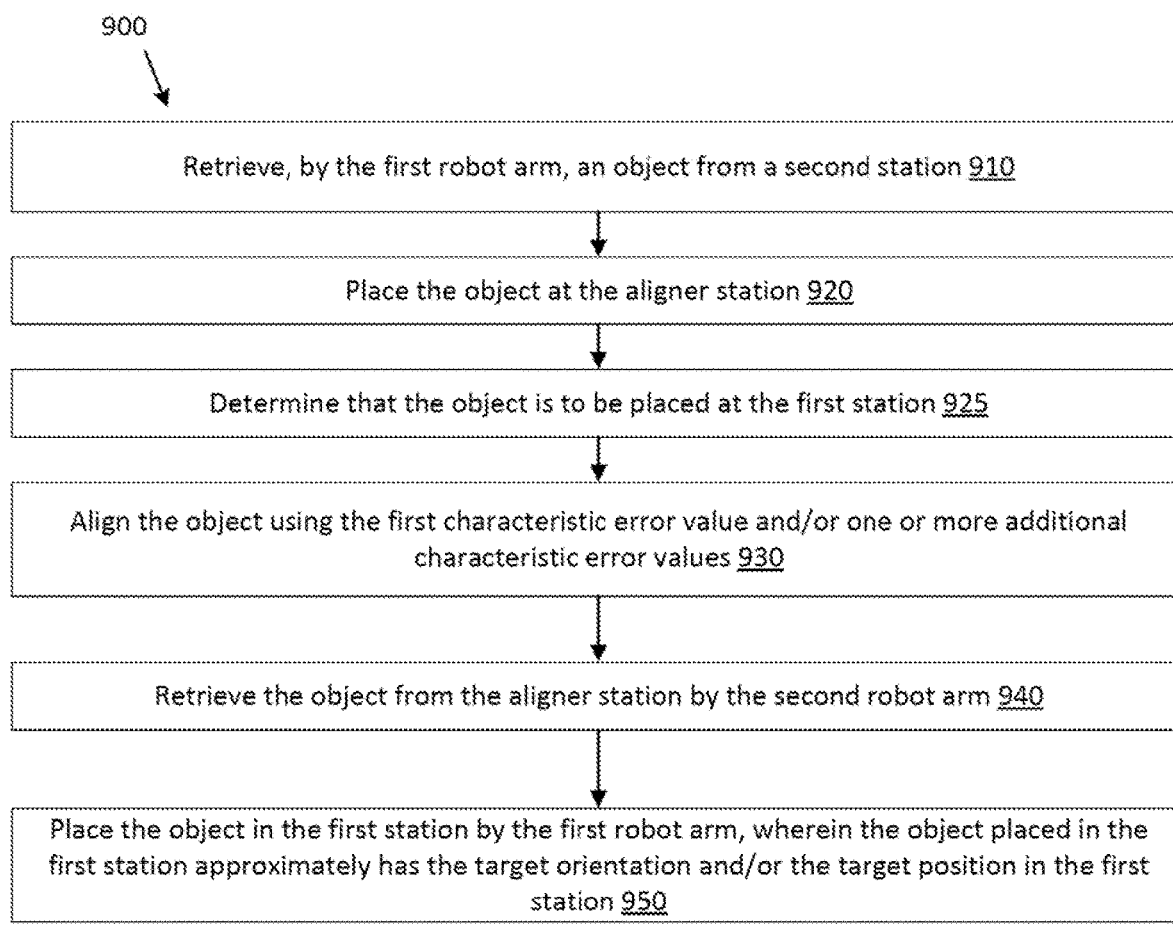
FIG. 9 is flow chart for a method of using a calibrated transfer sequence to transfer an object between an aligner station and a second station of an electronic processing system, according to embodiments of the present disclosure.

FIG. 9 is a flow chart of a method 900 for placing an object at a target orientation and/or a target position at a destination station based on one or more determined characteristic error values associated with a transfer sequence between a source station and the destination station, according to embodiments of the present disclosure. Method 900 may be performed after the calibration method 800 is performed. At block 910, a system controller causes the first robot arm (as introduced in FIG. 8) to retrieve an object (e.g., an edge ring, a cover wafer, a substrate, etc.) from a second station. The second station may be a cassette such as a FOUP. At block 920, the system controller causes the first robot arm to place the object at the aligner station. At block 925, the system controller determines that the object is to be placed at the first station (e.g., the processing chamber). The first station (introduced in FIG. 8) may be a FOUP, SSP, load lock, or other station in or attached to an FI.

At block 930, the system controller causes the aligner station to align the object using the first characteristic error value and optionally using one or more additional characteristic error values. The aligner station may align the object to a corrected target orientation that is based on the initial target orientation as adjusted by the first characteristic error value and/or to a corrected target position that is based on the initial target position as adjusted by the one or more additional characteristic error values. At block 940, the system controller causes the second robot arm to retrieve the object from the aligner station. In some embodiments, the one or more additional characteristic error values are used to adjust a positioning of the blade of the second robot arm during retrieval of the aligned object. For example, in embodiments the aligner station may not be able to adjust an x or y position of the object. However, the second robot arm may pick up the object such that the object is off center from a pocket of the blade of the second robot arm. The one or more additional characteristic error values may be used to determine how far off center to cause the object to be in the x and/or y directions.

At block 950, the system controller causes the first robot arm to place the object in the first station. The object placed in the first station has (or approximately has) the target orientation and/or the target position in the first station.

Figure 10:
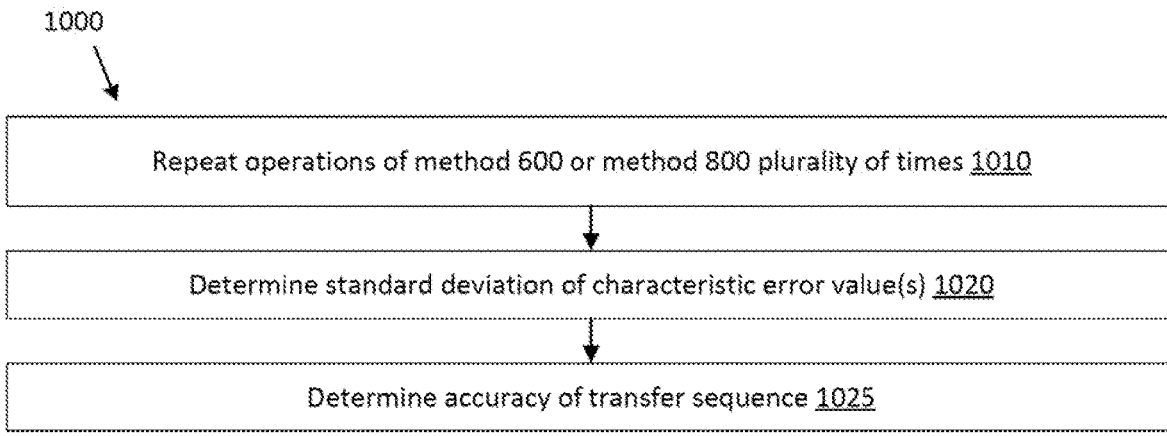
FIG. 10 is flow chart for a method of determining an accuracy of a transfer sequence between an aligner station and a second station of an electronic processing system, according to embodiments of the present disclosure.

FIG. 10 is flow chart for a method 1000 of determining an accuracy of a transfer sequence between an aligner station and a second station of an electronics processing system, according to embodiments of the present disclosure. Method 1000 may include at block 1010 repeating the operations of method 600 or of method 800 a plurality of times. Each iteration of performing method 600 or method 800 may provide slightly different results. For example, the first characteristic error value and/or one or more additional characteristic error values may be slightly different with each iteration. These differences in the characteristic error values from run to run may indicate a repeatability and/or accuracy of the transfer sequence that was calibrated. At block 1020, the system controller determines a standard deviation of the computed characteristic error values. For example, a standard deviation for the first characteristic error value (associated with orientation or yaw error) may be computed, a standard deviation for a second characteristic error value (associated with x-position error) may be computed and/or a standard deviation for a third characteristic error value (associated with z-position error) may be computed. At block 1025, an accuracy or repeatability of the transfer sequence may be determined based on the standard deviation(s).

Figure 11:
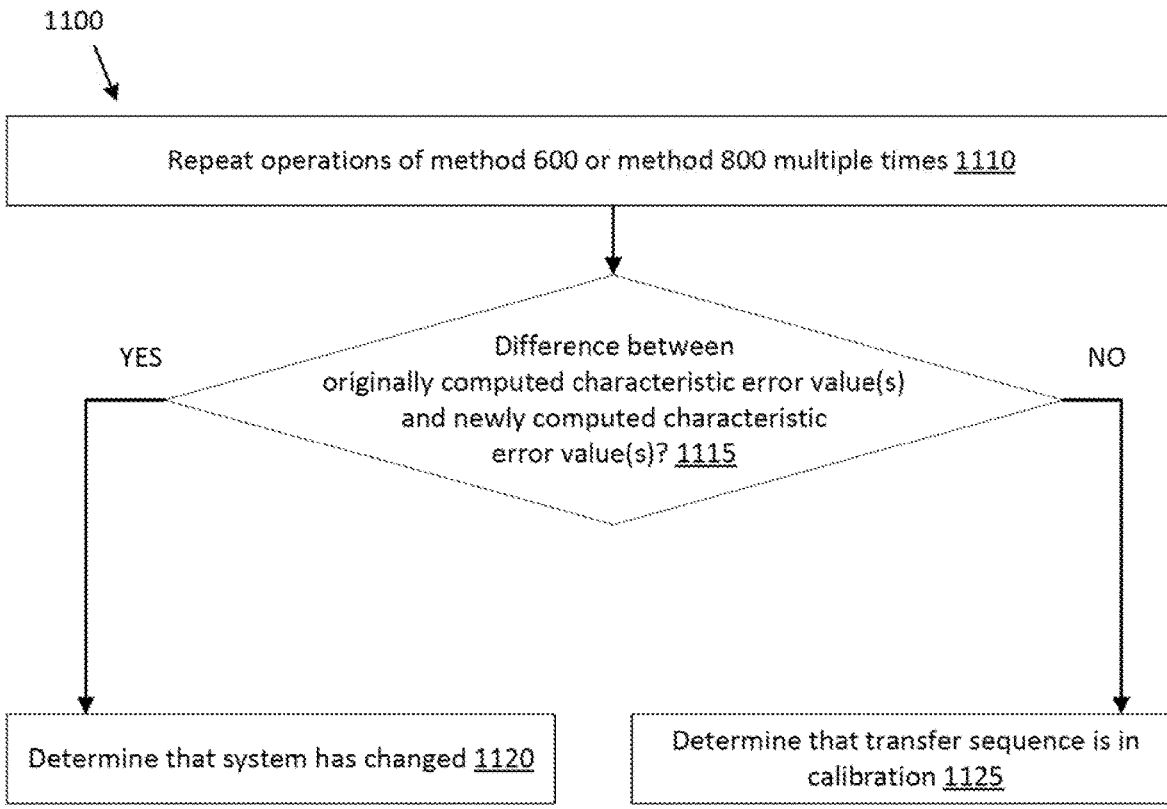
FIG. 11 is flow chart for a method of determining whether a transfer sequence is out of calibration, according to embodiments of the present disclosure.

FIG. 11 is flow chart for a method 1100 of determining whether a transfer sequence is out of calibration, according to embodiments of the present disclosure. A transfer sequence may be calibrated, and the actual position and/or orientation that is achieved for the transfer sequence may slowly drift over time after such calibration. This may be due to wear on one or more robots, for example. Additionally, or alternatively, a sudden shift may occur if, for example, a processing chamber is jarred or maintenance is performed on a processing chamber or robot. To detect such drift and/or sudden changes, calibration operations may be performed periodically.

At block 1110 of method 1100, the operations of method 600 or method 800 are performed multiple times. The operations of method 600 or method 800 may initially be performed to calibrate a transfer sequence. Subsequently, the operations of method 600 or method 800 may again be performed one or more times to verify that a previously performed calibration is still accurate.

At block 1115, the system controller compares the characteristic error values between the two or more times that the calibration procedure was performed. The system controller determines whether there are any differences between the different computations of the characteristic error values. For example, the system controller may determine whether there is a difference between the originally computed characteristic error value(s) and newly computed characteristic error value(s). If the calibration process has been performed more than twice, then multiple comparisons may be made. The system controller may determine, based on such comparisons, any drift in the computed characteristic error values or any sudden change in the characteristic error values. If a difference is determined and that difference exceeds a difference threshold, then the method proceeds to block 1120 and system controller determines that the system has changed (e.g., due to drift or a sudden change) and that the original result transfer sequence is out of calibration. The new result of the latest run of the calibration procedure may be used to overwrite the original characteristic error values. If there is no difference or a determined difference between the characteristic error values is below a threshold, then the method continues to block 1125 and the system controller determines that the transfer sequence is still in calibration.

Figure 12:
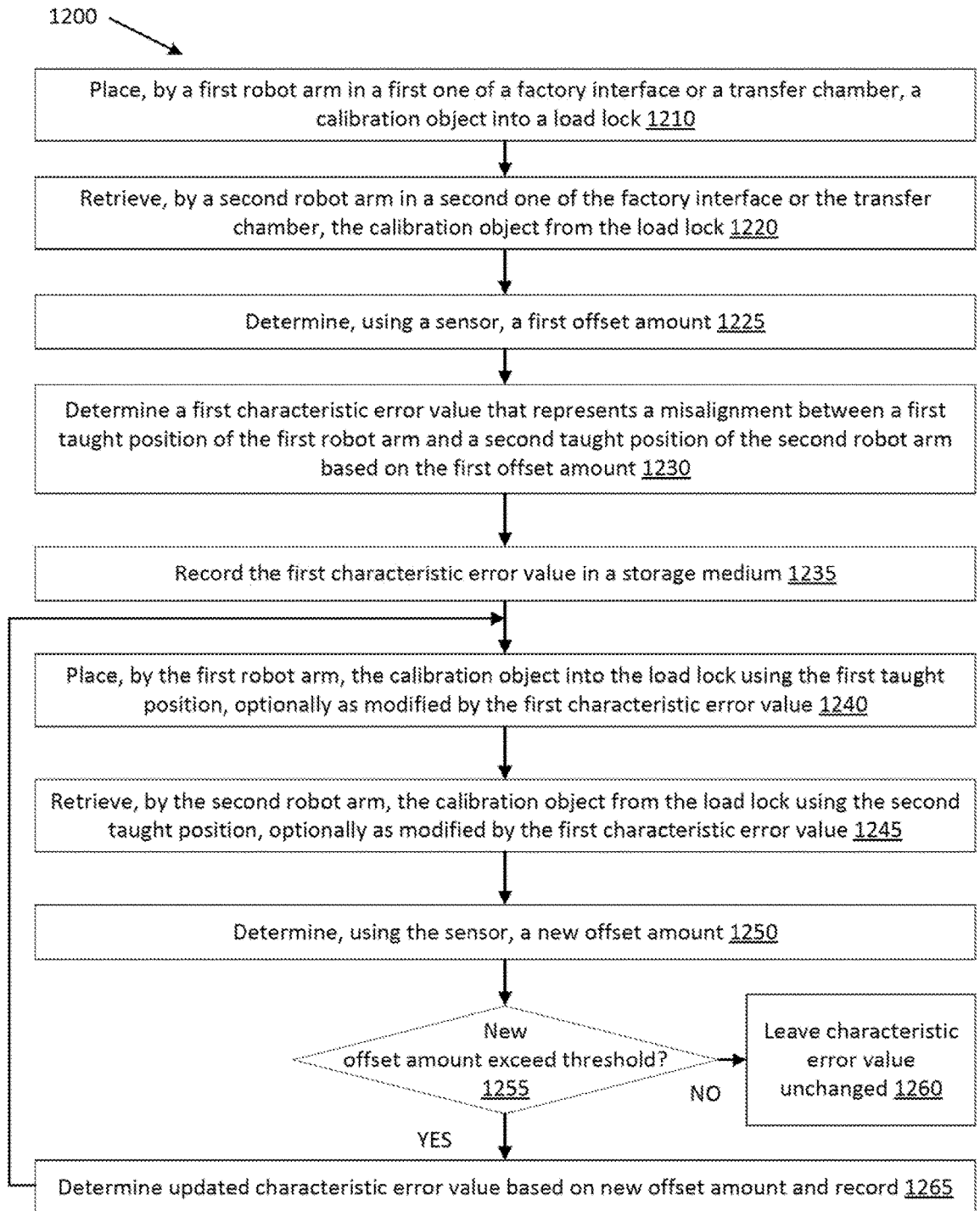
FIG. 12 is flow chart for a method of calibrating taught positions of two robot arms that transfer objects to one another via a load lock, according to embodiments of the present disclosure.

FIG. 12 is flow chart for a method 1200 of calibrating taught positions of two robot arms that transfer objects to one another via a load lock, according to embodiments of the present disclosure. At block 1210 of method 1200, a system controller causes a first robot arm in one of a factory interface or a transfer chamber to place a calibration object into a load lock. The calibration object may be a standard substrate or may be any other calibration object discussed herein. At block 1220, the system controller causes a second robot arm in a second one of the factory interface or the transfer chamber to retrieve the calibration object from the load lock. At block 1225, the system controller uses a sensor (e.g., an LCF or an aligner station) to determine a first offset amount between a first taught position of the first robot arm and a second taught position of the second robot arm. These two taught positions should line up, but often there is misalignment between the two. At block 1230, the system error determines a first characteristic error value that represents a misalignment between the first taught position of the first robot arm and the second taught position of the second robot arm based on the first offset amount. At block 1235, the system controller records the first characteristic error value in a storage medium.

The first characteristic error value may be used to correct for much of the misalignment between the first and taught positions. However, robot arms frequently overshoot or undershoot taught positions, which can be corrected by further refinement of corrections to the taught positions (e.g., determining finer or smaller additional characteristic error values). Accordingly, in one embodiment at block 1240 the system controller again causes the first robot arm to place the calibration object into the load lock. This time, the system controller causes the first robot arm to use the first taught position, optionally as modified by the first characteristic error value, to place the calibration object in the load lock. At block 1245, the system controller causes the second robot arm to use the second taught position, optionally as modified by the first characteristic error value, to retrieve the calibration object from the load lock. The first characteristic error value is used to adjust either the first taught position or the second taught position to correct for the determined offset.

At block 1250, the system controller uses the sensor (e.g., LCF or aligner station) to determine a new offset amount. The new offset amount will be less than the original offset amount that was determined at block 1225. At block 1255, the system controller determines whether the new offset amount meets or exceeds a threshold. If the difference is below the threshold, then the system controller determines that the calibration is complete and leaves the characteristic error value unchanged at block 1260. If the difference meets or exceeds the threshold, the method continues to block 1265. At block 1265, the system controller determines an updated characteristic error value based on the new offset amount. The new offset amount is added to (or subtracted from) the first characteristic error value that was computed at block 1230 (depending on whether the new characteristic error value is positive or negative relative to the first characteristic error value). The method then returns to block 1240, and the operations of blocks 1240 to 1255 are repeated. This process continues until at block 1255 system controller determines that the new offset amount is below the threshold.

Figure 13:
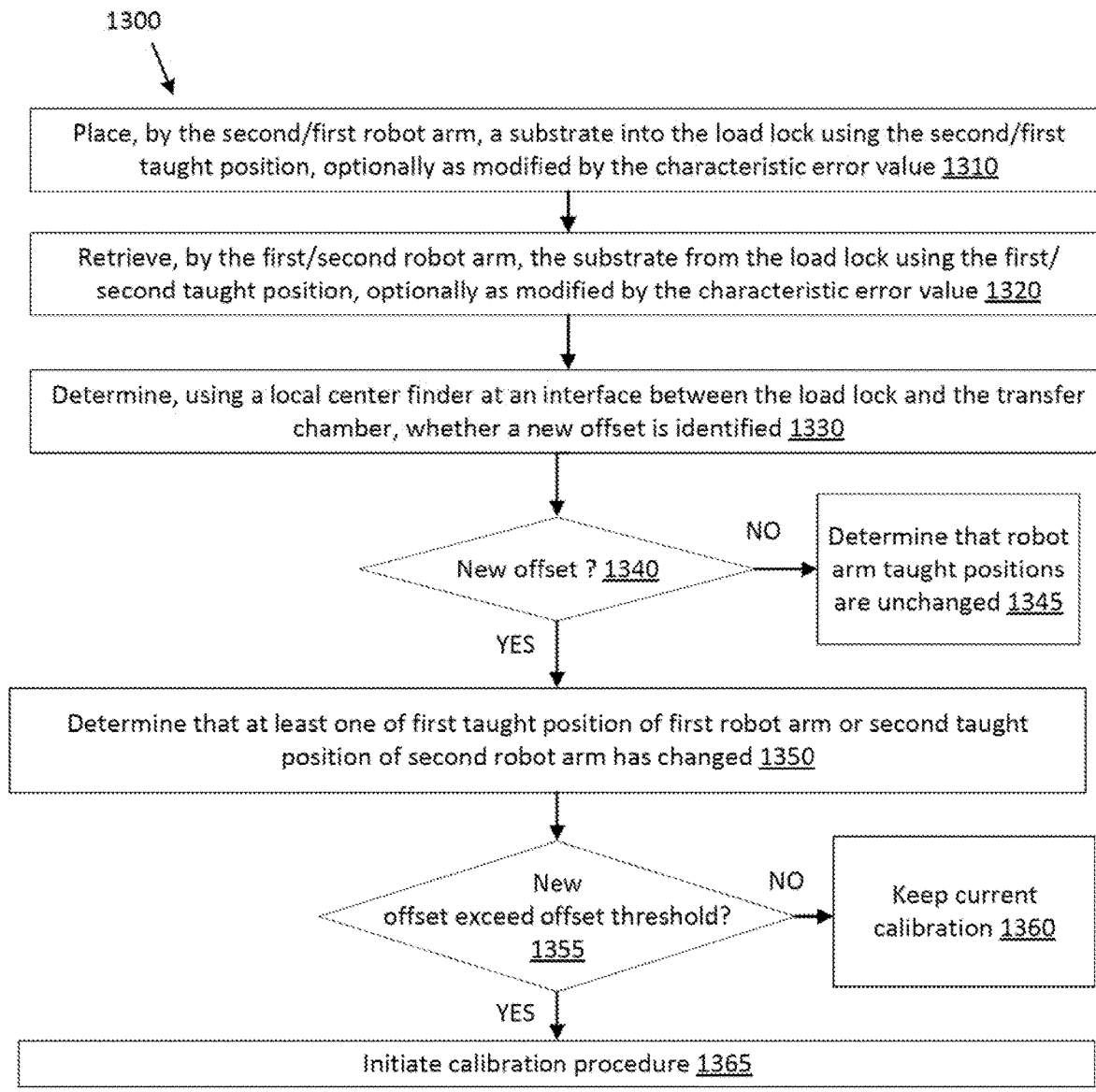
FIG. 13 is flow chart for a method of determining whether taught positions of two robot arms that transfer objects to one another via a load lock are calibrated to one another, according to embodiments of the present disclosure.

FIG. 13 is flow chart for a method 1300 of determining whether taught positions of two robot arms that transfer objects to one another via a load lock are calibrated to one another, according to embodiments of the present disclosure. Method 1300 may be performed periodically after method 1200 has been performed. At block 1310 of method 1300, a system controller causes a second or first robot arm (as set forth in FIG. 12) to place a substrate into the load lock using the second or first taught position, respectively, optionally as modified by the characteristic error value. If the first robot arm is on a transfer chamber robot, then the second robot arm is on the FI robot and places the substrate using the second taught position. If the first robot arm is on the FI robot, then the first robot arm places the substrate using the first taught position.

At block 1320, the system controller causes the first or second arm to retrieve the substrate from the load lock using the first or second taught position, respectively, optionally as modified by the characteristic error value. Either the first taught position or second taught position is modified by the characteristic error value (e.g., offsetting to an inverse of the offset associated with the characteristic error value) at block 1310 or the first taught position or second taught position is modified by the characteristic error value at block 1320.

At block 1330, the system controller determines, using a local center finder at an interface between the load lock and the transfer chamber, whether a new offset is identified. A center of the substrate should be aligned with a center of the pocket on the blade of the robot arm of the transfer chamber robot and/or with a center of the LCF when the substrate is retrieved at block 1320. However, robot error or drift in either or both of the transfer chamber robot or FI robot may cause there to be offset.

At block 1340, the system controller determines whether an offset is detected. If an offset is detected, the method proceeds to block 1350. If no offset is detected, the method continues to block 1345, and the system controller determines that the robot arm taught positions are unchanged and that the calibration is still accurate.

At block 1350, the system controller determines that at least one of the first taught position of the first robot arm or the second taught position of the second robot arm has changed (or that the robot arms' ability to achieve the taught position has changed). At block 1355, the system controller determines whether the offset exceeds an offset threshold. If the offset is below the offset threshold, the method continues to block 1360 and the current calibration is maintained. If the new offset meets or exceeds the offset threshold, the method continues to block 1365 and a calibration procedure (e.g., the calibration procedure of method 1200) is initiated.

Figure 14:
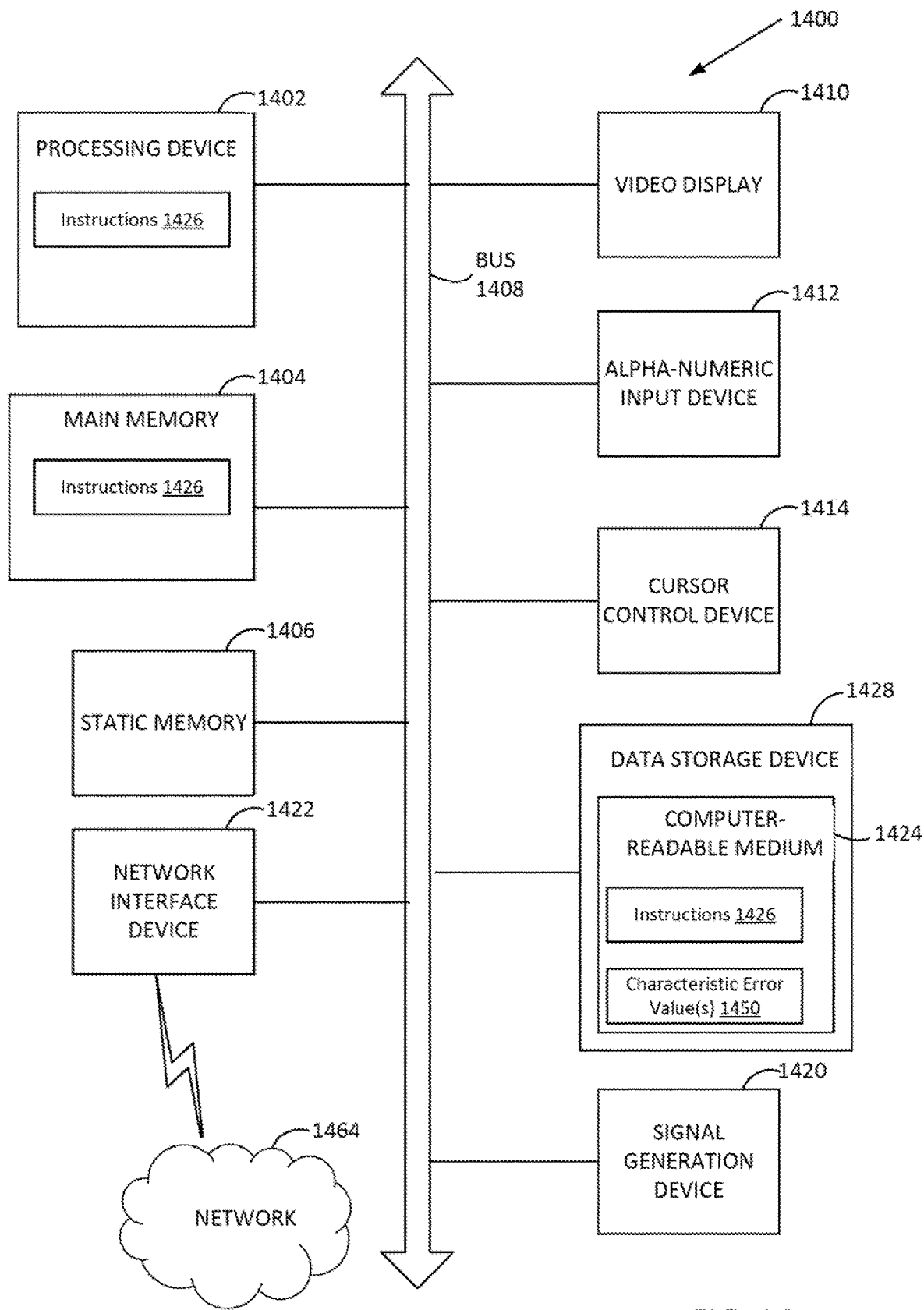
FIG. 14 is an example computing device that may operate as a controller for an electronics processing system, in accordance with embodiments of the present disclosure.

FIG. 14 is an example computing device 1400 that may operate as a system controller for an electronics processing system, in accordance with embodiments of the present disclosure. The computing device 1400 is a machine within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In an embodiment, computing device 1400 corresponds to system controller 132 of FIG. 1. In one embodiment, system controller 132 is a component of computing device 1400.

The example computing device 1400 includes a processing device 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a secondary memory (e.g., a data storage device 1412), which communicate with each other via a bus 1408.

Processing device 1402 represents one or more general-purpose processors such as a microprocessor, central processing unit, or the like. More particularly, the processing device 1402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. Processing device 1402 is configured to execute the processing logic (instructions 1422) for performing the operations discussed herein. In one embodiment, system controller 132 corresponds to processing device 1402. In embodiments, processing device 1402 executes instructions 1426 to implement any of methods 600-1300 in embodiments.

The computing device 1400 may further include a network interface device 1408. The computing device 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), and a signal generation device 1416 (e.g., a speaker).

The data storage device 1418 may include a machine-readable storage medium (or more specifically a computer-readable storage medium) 1428 on which is stored one or more sets of instructions 1422 embodying any one or more of the methodologies or functions described herein. The instructions 1422 may also reside, completely or at least partially, within the main memory 1404 and/or within the processing device 1402 during execution thereof by the computer system 1400, the main memory 1404 and the processing device 1402 also constituting computer-readable storage media.

The computer-readable storage medium 1428 may also be used to store instructions 1426 and/or characteristic error values 1450 as discussed herein above. While the computer-readable storage medium 1428 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium other than a carrier wave that is capable of storing or encoding a set of instructions for execution by the machine and that cause the machine to perform any one or more of the methodologies described herein. The term "computer-readable storage medium" shall accordingly be taken to include, but not be limited to, the non-transitory media including solid-state memories, and optical and magnetic media.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An electronics processing system comprising:
a factory interface;
a load lock, wherein a first side of the load lock is connected to the factory interface;
a transfer chamber connected to a second side of the load lock;
a local center finder at an interface between the load lock and the transfer chamber; and
a controller, wherein the controller is configured to:
cause a first robot arm in the factory interface to place a calibration object into the load lock, wherein the calibration object is to be placed into the load lock such that a calibration object center is at a first target location associated with a first taught position of the first robot arm, wherein a first pocket center of a first blade of the first robot arm nominally corresponds to the first target location for the first taught position;
cause a second robot arm in a transfer chamber to retrieve the calibration object from the load lock onto a second blade of the second robot arm using a second taught position of the second robot arm, wherein a second pocket center of the second blade nominally corresponds to the first target location for the second taught position, and wherein the calibration object center is offset from the second pocket center by a first offset amount after retrieving the calibration object;
determine, based on data captured by the local center finder while the calibration object is removed from the load lock by the second robot arm, the first offset amount between the calibration object center and the second pocket center;
determine a first characteristic error value that represents a misalignment between the first taught position of the first robot arm and the second taught position of the second robot arm based on the first offset amount; and
record the first characteristic error value in a storage medium, wherein one of the first robot arm or the second robot arm is to use the first characteristic error value to compensate for the misalignment for objects transferred between the first robot arm and the second robot arm via the load lock.

2. The electronics processing system of claim 1, wherein the controller is further to:
cause the first robot arm to place the calibration object into the load lock using the first taught position of the first robot arm, optionally as modified by the first characteristic error value;
cause the second robot arm to retrieve the calibration object from the load lock using the second taught position of the second robot arm, optionally as modified by the first characteristic error value, wherein one of the first taught position or the second taught position is modified based on the first characteristic error value to compensate for the first offset amount, and wherein the calibration object center is offset from the second pocket center by a second offset amount after retrieving the calibration object; and
determine, using the local center finder, the second offset amount between the calibration object center and the second pocket center.

3. The electronics processing system of claim 2, wherein the controller is further to:
determine that the second offset amount exceeds an offset threshold; and
determine an updated characteristic error value based on the second offset amount; and
record the updated characteristic error value in the storage medium.

4. The electronics processing system of claim 2, wherein the controller is further to:
determine that the second offset amount is less than an offset threshold; and
leave the first characteristic error value unchanged.

5. The electronics processing system of claim 1, wherein the controller is further to:
cause the first robot arm to place a substrate to be processed into the load lock using the first taught position of the first robot arm, optionally as modified by the first characteristic error value;
cause the second robot arm to retrieve the substrate from the load lock using the second taught position, optionally as modified by the first characteristic error value, wherein one of the first taught position or the second taught position is modified based on the first characteristic error value to compensate for the first offset amount; and
determine, using the local center finder, whether a new offset exists between a substrate center of the substrate and the second pocket center.

6. The electronics processing system of claim 5, wherein the controller is further to:
responsive to determining that the new offset exists, determine that at least one of the first taught position of the first robot arm or the second taught position of the second robot arm has changed.

7. The electronics processing system of claim 1, wherein the controller is further to:
initiate repetition of placing of the calibration object by the first robot arm, retrieving of the calibration object by the second robot arm, determining of the first offset amount, and determining of the first characteristic error value a plurality of times;
determine a standard deviation of the first characteristic error value resulting from repeating of the placing of the calibration object by the first robot arm, the retrieving of the calibration object by the second robot arm, the determining of the first offset amount, and the determining of the first characteristic error value the plurality of times; and
determine an accuracy of a transfer sequence between the first robot arm and the second robot arm via the load lock based on the standard deviation.

8. The electronics processing system of claim 1, wherein the calibration object comprises a substrate.

9. An electronics processing system comprising:
a factory interface;
a load lock, wherein a first side of the load lock is connected to the factory interface;

a transfer chamber connected to a second side of the load lock; and a controller, wherein the controller is to:
cause a first robot arm in a first one of the factory interface or the transfer chamber to place a calibration object into the load lock, wherein the calibration object is to be placed into the load lock such that a calibration object center is at a first target location associated with a first taught position of the first robot arm, wherein a first pocket center of a first blade of the first robot arm nominally corresponds to the first target location for the first taught position;
cause a second robot arm in a second one of the factory interface or the transfer chamber to retrieve the calibration object from the load lock onto a second blade of the second robot arm using a second taught position of the second robot arm, wherein a second pocket center of the second blade nominally corresponds to the first target location for the second taught position, and wherein the calibration object center is offset from the second pocket center by a first offset amount after retrieving the calibration object;
determine, using a laser-based sensor that is in or connected to the second one of the factory interface or the transfer chamber, the first offset amount between the calibration object center and the second pocket center;
determine a first characteristic error value that represents a misalignment between the first taught position of the first robot arm and the second taught position of the second robot arm based on the first offset amount;
record the first characteristic error value in a storage medium, wherein one of the first robot arm or the second robot arm is to use the first characteristic error value to compensate for the misalignment for objects transferred between the first robot arm and the second robot arm via the load lock;
initiate repetition of placing of the calibration object by the first robot arm, retrieving of the calibration object by the second robot arm, determining of the first offset amount, and determining of the first characteristic error value a plurality of times;
determine a standard deviation of the first characteristic error value resulting from repeating of the placing of the calibration object by the first robot arm, the retrieving of the calibration object by the second robot arm, the determining of the first offset amount, and the determining of the first characteristic error value the plurality of times; and
determine an accuracy of a transfer sequence between the first robot arm and the second robot arm via the load lock based on the standard deviation.

10. The electronics processing system of claim 9, wherein the first robot arm is in the transfer chamber, wherein the second robot arm is in the factory interface, wherein the laser-based sensor comprises an alignment station in or attached to the factory interface, and wherein the controller is further to:
cause the second robot arm to place the calibration object onto the alignment station.

11. The electronics processing system of claim 10, wherein the controller is further to:
cause the second robot arm to place a substrate to be processed into the load lock using the second taught position of the second robot arm, optionally as modified by the first characteristic error value;
cause the first robot arm to retrieve the substrate from the load lock using the first taught position of the first robot arm, optionally as modified by the first characteristic error value, wherein one of the first taught position or the second taught position is modified based on the first characteristic error value to compensate for the first offset amount;
determine, using a local center finder at an interface between the load lock and the transfer chamber, whether a new offset exists between a substrate center of the substrate and the first pocket center; and
responsive to determining that the new offset exists, determine that at least one of the first taught position of the first robot arm or the second taught position of the second robot arm has changed.

12. The electronics processing system of claim 11, wherein the controller is further to:
determine whether the new offset exceeds an offset threshold; and
responsive to determining that the new offset exceeds the offset threshold, initiate a calibration procedure.

13. The electronics processing system of claim 9, wherein the controller is further to:
cause the first robot arm to place the calibration object into the load lock using the first taught position of the first robot arm, optionally as modified by the first characteristic error value;
cause the second robot arm to retrieve the calibration object from the load lock using the second taught position of the second robot arm, optionally as modified by the first characteristic error value, wherein one of the first taught position or the second taught position is modified based on the first characteristic error value to compensate for the first offset amount, and wherein the calibration object center is offset from the second pocket center by a second offset amount after retrieving the calibration object; and
determine, using the laser-based sensor, the second offset amount between the calibration object center and the second pocket center.

14. The electronics processing system of claim 13, wherein the controller is further to:
determine that the second offset amount exceeds an offset threshold; and
determine an updated characteristic error value based on the second offset amount; and
record the updated characteristic error value in the storage medium.

15. The electronics processing system of claim 13, wherein the controller is further to:
determine that the second offset amount is less than an offset threshold; and
leave the first characteristic error value unchanged.

16. The electronics processing system of claim 9, wherein the controller is further to:
cause the first robot arm to place a substrate to be processed into the load lock using the first taught position of the first robot arm, optionally as modified by the first characteristic error value;
cause the second robot arm to retrieve the substrate from the load lock using the second taught position, optionally as modified by the first characteristic error value, wherein one of the first taught position or the second taught position is modified based on the first characteristic error value to compensate for the first offset amount; and determine, using the laser-base sensor, whether a new offset exists between a substrate center of the substrate and the second pocket center.

17. The electronics processing system of claim 16, wherein the controller is further to:

responsive to determining that the new offset exists, determine that at least one of the first taught position of the first robot arm or the second taught position of the second robot arm has changed.

18. The electronics processing system of claim 9, wherein the calibration object comprises a substrate.

* * * * *